(12) United States Patent
Balakrishnan et al.

(10) Patent No.: US 10,056,482 B2
(45) Date of Patent: Aug. 21, 2018

(54) IMPLEMENTATION OF LONG-CHANNEL THICK-OXIDE DEVICES IN VERTICAL TRANSISTOR FLOW

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/485,457

(22) Filed: Apr. 12, 2017

(65) Prior Publication Data
US 2017/0222048 A1  Aug. 3, 2017

Related U.S. Application Data

(62) Division of application No. 14/979,939, filed on Dec. 28, 2015, now Pat. No. 9,698,145.

(51) Int. Cl.
*H01L 27/00* (2006.01)
*H01L 29/78* (2006.01)
(Continued)

(52) U.S. Cl.
CPC .... *H01L 29/7827* (2013.01); *H01L 21/76224* (2013.01); *H01L 21/823412* (2013.01); *H01L 21/823437* (2013.01); *H01L 21/823481* (2013.01); *H01L 21/823487* (2013.01); *H01L 27/088* (2013.01); *H01L 29/0649* (2013.01); *H01L 29/0847* (2013.01);
(Continued)

(58) Field of Classification Search
None
See application file for complete search history.

(56) References Cited

U.S. PATENT DOCUMENTS 5,571,730 A * 11/1996 Park ................. H01L 27/10823
257/E21.646
6,903,411 B1 * 6/2005 Chyan ............... H01L 21/76895
257/327

(Continued)

OTHER PUBLICATIONS

List of IBM Patents or Patent Applications Treated As Related (Appendix P); Filed Apr. 12, 2017, 2017, 2 pages.

(Continued)

*Primary Examiner* — Ali Naraghi
(74) *Attorney, Agent, or Firm* — Cantor Colburn LLP; Louis Percello

(57) ABSTRACT

A method for fabricating a semiconductor structure is provided that includes the steps of: forming a structure including a substrate, a counter-doped layer on the substrate, and a heavily doped source contact layer on a side of the counter-doped layer opposite the substrate; and forming an oxide layer on a side of the heavily doped source contact layer opposite the counter-doped layer, wherein the oxide layer has a vertical dimension that is a difference between a length of a long channel thick oxide device and a length of a short channel non-thick oxide device.

4 Claims, 24 Drawing Sheets

(51) Int. Cl.
*H01L 29/08* (2006.01)
*H01L 27/088* (2006.01)
*H01L 29/66* (2006.01)
*H01L 29/06* (2006.01)
*H01L 21/8234* (2006.01)
*H01L 21/762* (2006.01)

(52) U.S. Cl.
CPC .... *H01L 29/6656* (2013.01); *H01L 29/66545* (2013.01); *H01L 29/66666* (2013.01)

(56) References Cited

U.S. PATENT DOCUMENTS

| | | | |
|---|---|---|---|
| 2014/0315362 A1* | 10/2014 | Li | H01L 21/823857 438/218 |
| 2015/0303202 A1* | 10/2015 | Sun | H01L 21/823487 257/392 |
| 2015/0318282 A1* | 11/2015 | Rodder | H01L 21/823418 257/392 |
| 2017/0207312 A1* | 7/2017 | Jan | H01L 29/42376 |

OTHER PUBLICATIONS

Karthik Balakrishnan et al. "Implementation of Long-Channel Thick-Oxide Devices in Vertical Transistor Flow," U.S. Appl. No. 14/979,939, filed Dec. 28, 2015.

* cited by examiner

IMPLEMENTATION OF LONG-CHANNEL THICK-OXIDE DEVICES IN VERTICAL TRANSISTOR FLOW

DOMESTIC PRIORITY

This application is a divisional of U.S. application Ser. No. 14/979,939, titled "IMPLEMENTATION OF LONG-CHANNEL THICK-OXIDE DEVICES IN VERTICAL TRANSISTOR FLOW," filed Dec. 28, 2015, the disclosure of which is incorporated by reference herein in its entirety.

BACKGROUND

The present disclosure generally relates to the field of semiconductors, and more particularly relates to long channel thick oxide devices implemented in vertical transistors.

Vertical transistors are attractive candidates for 5 nm node and beyond due to their potential of better density scaling and allowing relaxed gate lengths to better control the electrostatics without any sacrifice to gate contacted pitch size. Integration of long channel thick oxide devices with thicker oxide, for example of I/O devices or ultra-low-power devices, along with short channel vertical field-effect-transistors (FETs) would be beneficial.

SUMMARY

In an embodiment of the invention, a method for making a semiconductor structure is provided that includes the steps of forming a structure including a substrate, a counter-doped layer on the substrate, and a heavily doped source contact layer on a side of the counter-doped layer opposite the substrate; and forming an oxide layer on a side of the heavily doped source contact layer opposite the counter-doped layer, wherein the oxide layer has a vertical dimension that is a difference between a length of a long channel thick oxide device and a length of a short channel non-thick oxide device.

In an embodiment of the invention, a method for making a semiconductor structure is provided that includes the steps of forming a structure comprising a substrate, a counter-doped layer on the substrate, and a heavily doped source contact layer on a side of the counter-doped layer opposite the substrate; forming an oxide layer on a side of the heavily doped source contact layer opposite the counter-doped layer, wherein the oxide layer has a vertical dimension that is a difference between a length of a long channel thick oxide device and a length of a short channel non-thick oxide device; removing a portion of the oxide layer from a first region of the structure; epitaxially growing the heavily doped source contact layer in the first region following the removal of the portion of the oxide layer in the first region; forming a shallow trench isolation between the first region and a second region that extends from a top surface of the structure to partially into the substrate; forming a first channel in the first region of the structure, the first channel extending from the top surface of the structure down to a top surface of the heavily doped source contact layer; forming a second channel in the second region of the structure, the second channel extending from the top surface of the structure down to a top surface of the heavily doped source contact layer; epitaxially growing a first channel layer up from the top surface of the heavily doped source contact layer, the first channel layer filling the first channel; and epitaxially growing a second channel layer up from the top surface of the heavily doped source contact layer, the second channel layer filling the second channel.

In another embodiment of the invention, a semiconductor structure is provided that includes, a substrate; a first device having a first thickness on a first region of the substrate; and a second device having a second thickness on a second region of the substrate, wherein the second thickness is greater than the first thickness.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
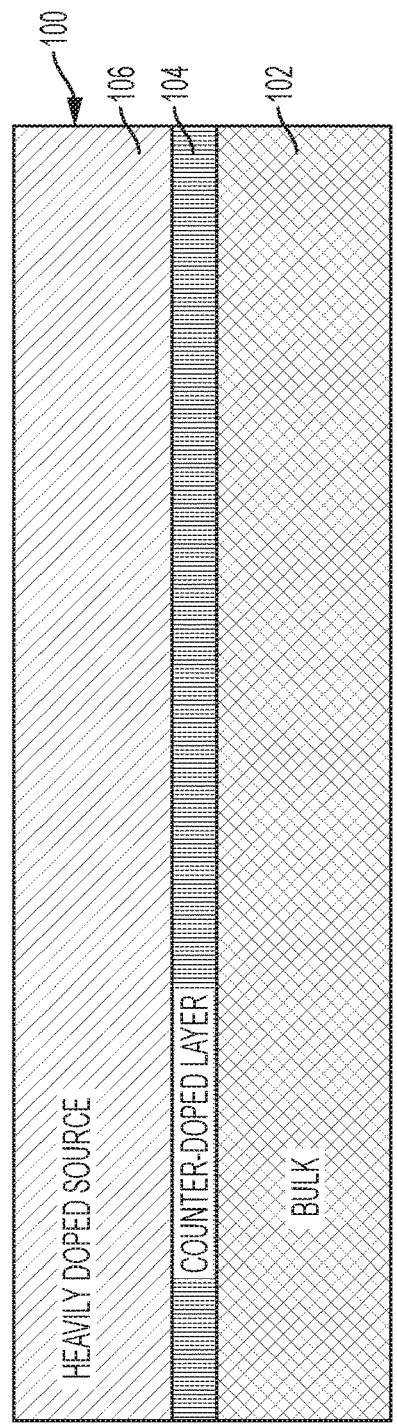
FIG. 1 is a cross-sectional view of an initial semiconductor structure according to one embodiment of the present disclosure.

As stated above, the present invention relates to the field of semiconductors, and more particularly relates to implementation of long channel thick oxide devices with vertical field-effect-transistors, which are now described in detail with accompanying figures. On chip long channel devices are useful for example, for system on chip (SoC) applications typically with about 100 to about 200 nanometer (nm) gate length and thicker oxide, for example a thicker oxide having an equivalent oxide thickness (EOT) of about three (3) nm. It is noted that like reference numerals refer to like elements across different embodiments.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-24 illustrate various processes for fabricating long channel thick oxide devices with vertical field-effect-transistors (FETs). FIG. 1 shows a partially fabricated semiconductor device 100 comprising a bulk substrate 102, a counter-doped layer 104, and a source contact layer 106.

The thickness of the substrate 102 can be, for example, from 300 microns to 1,000 microns, although lesser and greater thicknesses can be employed as well. The substrate 102 can be single crystalline and or a bulk substrate, a semiconductor-on-insulator (SOI) substrate, or a hybrid substrate. An insulator layer (not shown) comprising a dielectric material such as silicon oxide, silicon nitride, silicon oxynitride, or any combination thereof can be formed on and in contact with the substrate 102.

The substrate 102 can be appropriately doped either with p-type dopant atoms or with n-type dopant atoms, or the material can be substantially undoped (intrinsic). The dopant concentration of the substrate 102 can be from $1.0 \times 10^{15}/cm^3$ to $1.0 \times 10^{19}/cm^3$, and in one embodiment, is from $1.0 \times 10^{16}$ $cm^3$ to $3.0 \times 10^{18}/cm^3$, although lesser and greater dopant concentrations are applicable as well. The counter-doped layer 104 is formed on an in contact with the substrate 102 (or a buried insulator layer if formed). The counter-doped layer 104 is formed by an epitaxial growth of a semiconductor material. The counter-doped layer can then be implanted with dopants and annealed using, for example, rapid thermal anneal. Alternatively, the counter-doped layer can be doped in-situ during the epitaxial growth. The purpose of the counter-doped layer is to provide isolation between one transistor and the next transistor. The source contact layer 106 is formed on and in contact with the counter-doped layer 104. The source contact 106 can be, for example, an n++ doped region of the substrate 102 and can have a thickness in a range of, for example, about 10 nm to about 200 nm. However, other thicknesses are applicable as well. The source contact region can be formed by epitaxial growth.

An epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor. The material can have a doping level from about $1.0\times10^{16}/cm^3$ to about $1.0\times10^{18}/cm^3$.

Figure 2:
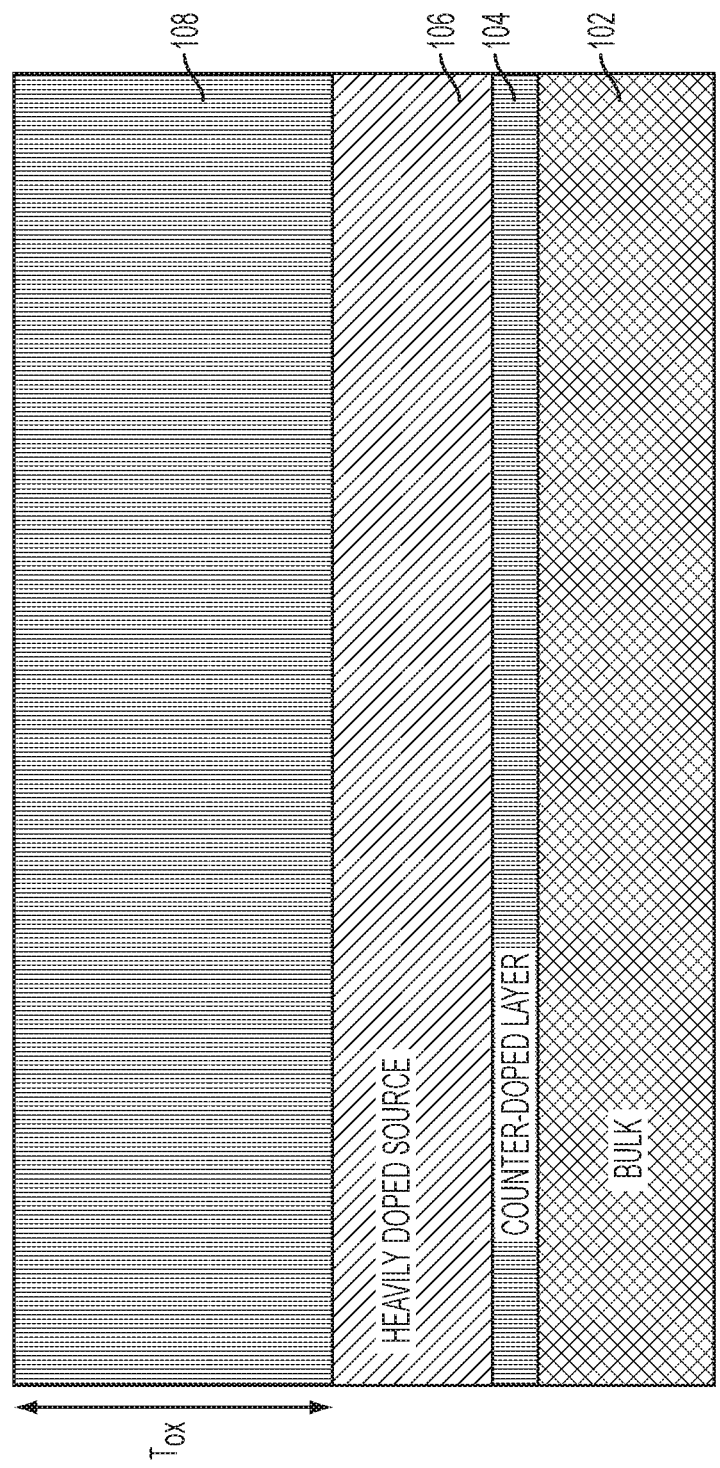
FIG. 2 is a cross-sectional view of the semiconductor structure after an oxide layer has been formed according to one embodiment of the present disclosure.

FIG. 2 shows an oxide layer 108 is deposited on the heavily doped source layer 106 on a side opposite the counter-doped layer 104. The oxide layer can have a height of about 100 to about 200 nm. The height ($T_{OX}$) of the oxide layer is determined by the desired dimensions of the long channel and short channel devices according to the formula $T_{OX}=L_{LC}-L_{SC}$. In other words $T_{OX}$ is the difference of the vertical dimensions of the long channel thick oxide device and the regular high performance device. For example, if the thick oxide device has an $L_{LC}$ of 100 nm and the regular high performance device has an $L_{SC}$ of 25 nm, then $T_{OX}=100-25=75$ nm.

Figure 3:
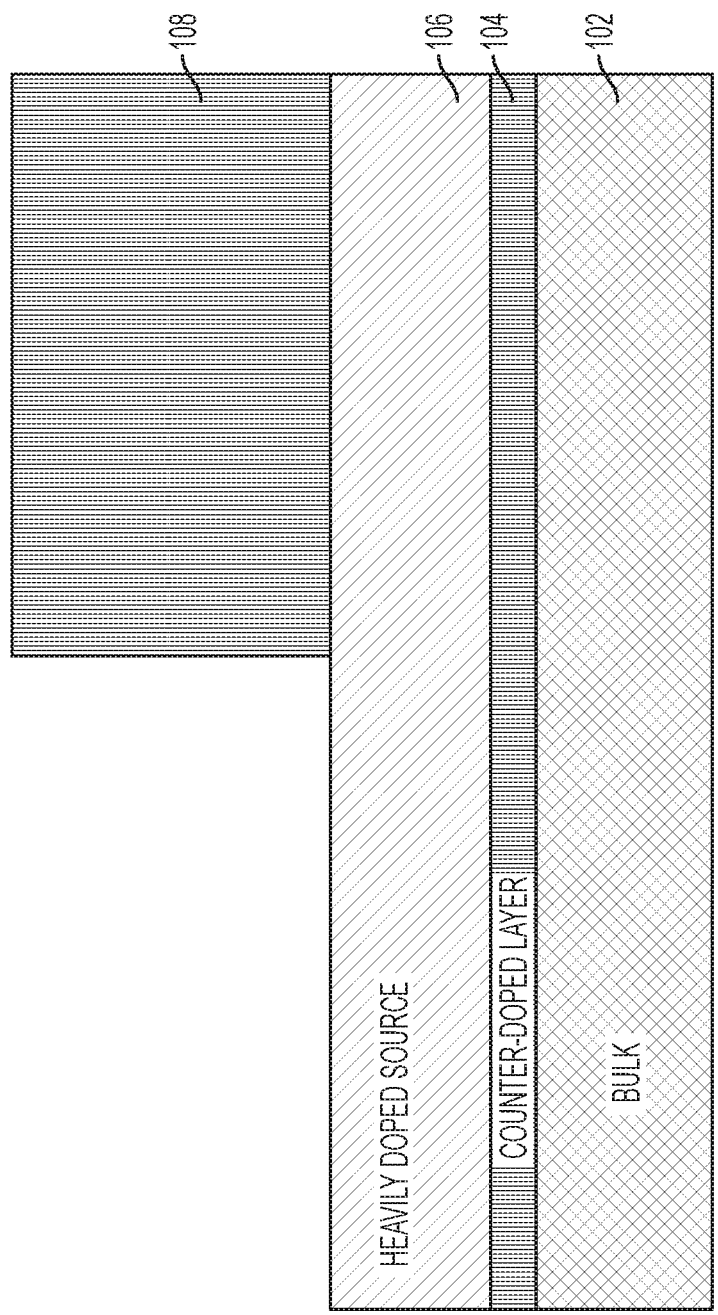
FIG. 3 is a cross-sectional view of the semiconductor structure after the portion of the oxide layer in the short channel non-thick oxide device region has been removed according to one embodiment of the present disclosure.
Figure 4:
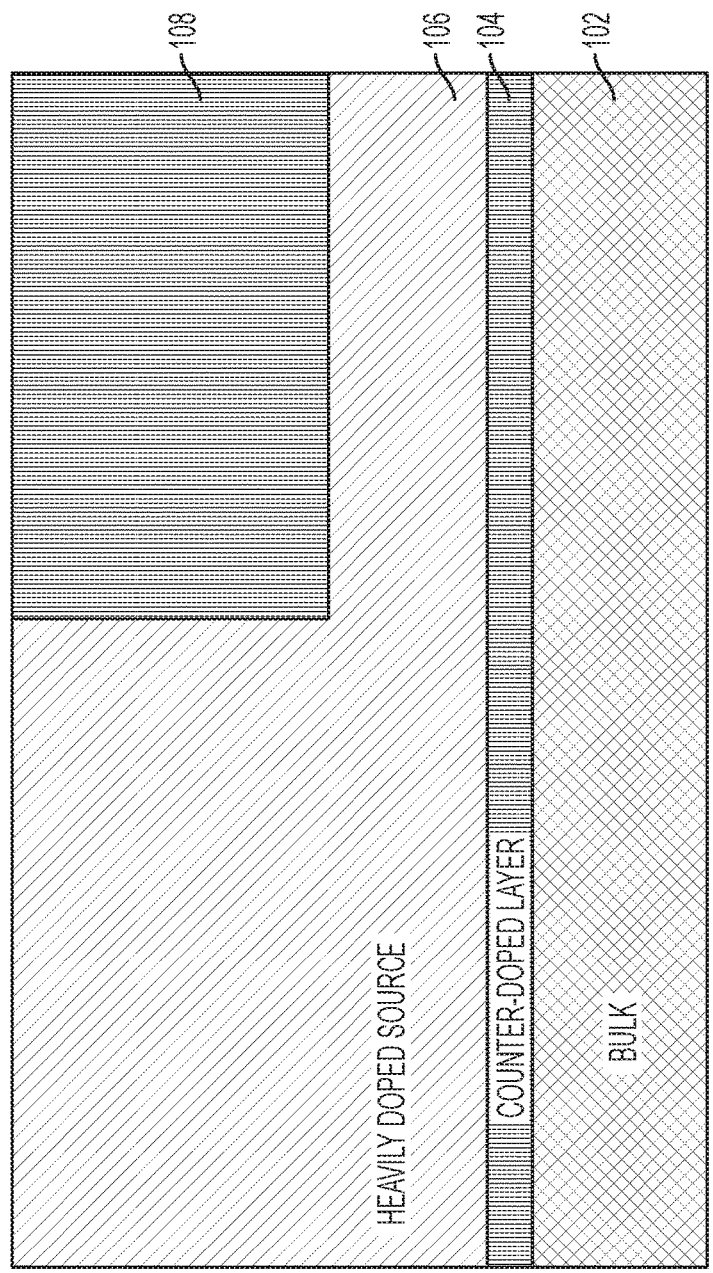
FIG. 4 is a cross-sectional view of the semiconductor structure after epitaxial growth of the heavily doped source layer in the short channel non-thick oxide device region according to one embodiment of the present disclosure.

FIG. 3 shows that the oxide layer is patterned and reaction ion etching (RIE) is used to remove oxide from the non-thick oxide device 110. FIG. 4 shows that an epitaxial process is used to grow the heavily doped source layer in the region from which the oxide was removed by RIE. The material can have a doping level from about $1.0\times10^{16}/cm^3$ to about $1.0\times10^{18}$ cm$^3$.

Figure 5:
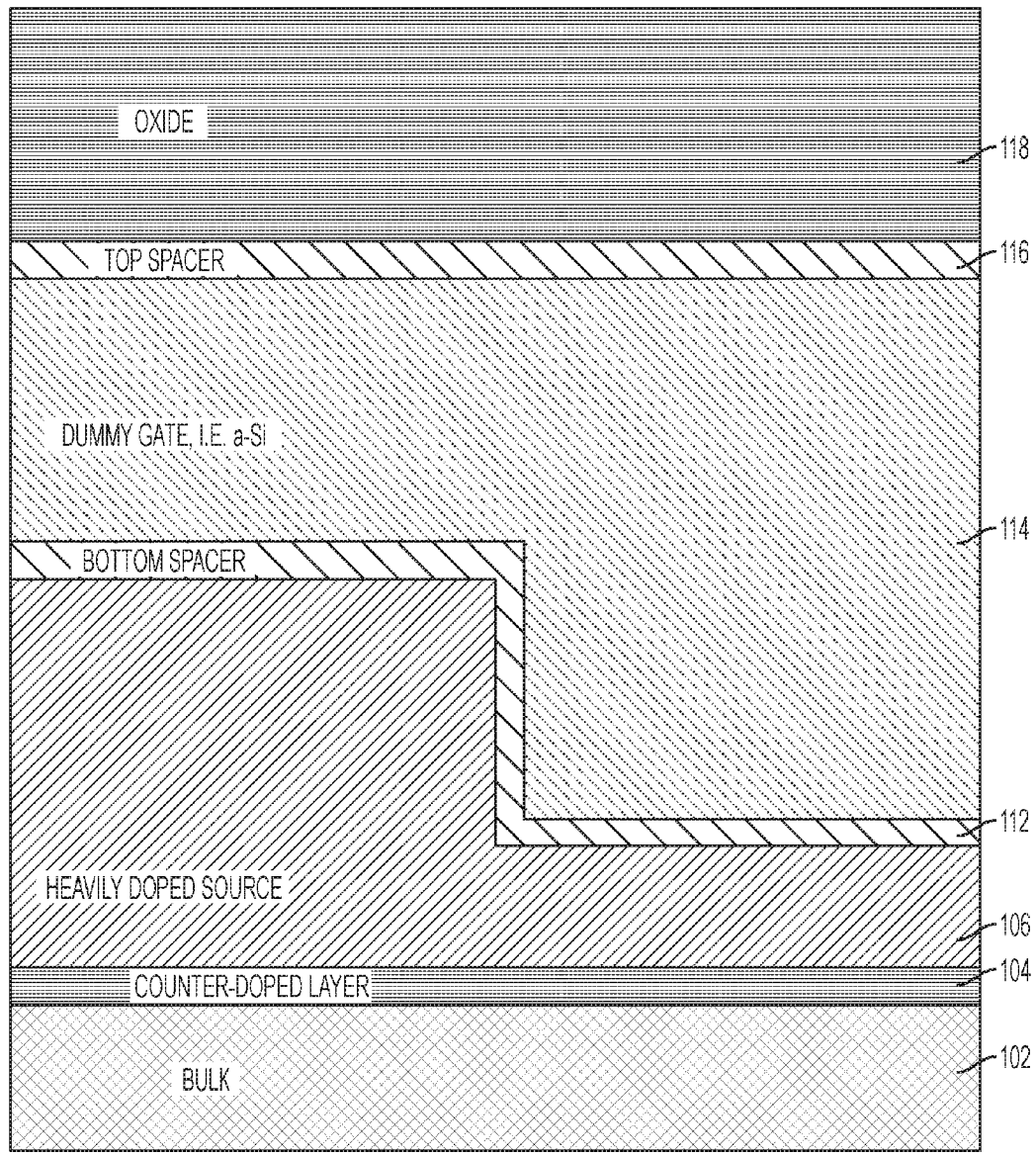
FIG. 5 is a cross-sectional view of the semiconductor structure after the oxide layer has been removed, and a first (bottom) spacer, "dummy" replacement gate, second (top) spacer, and top oxide layer have been formed according to one embodiment of the present disclosure.

FIG. 5 shows the addition of a first (bottom) spacer layer 112, a replacement (dummy) gate 114, a second (top) spacer layer 116), and a top oxide layer 118. The oxide is removed with diluted hydrofluoric acid (DHF). The first spacer 112 is formed on and in contact with the source layer 106. The spacer 112 comprises a dielectric material (such as silicon oxide, silicon nitride, silicon oxynitride, or a combination of these) and can be formed using any conventional deposition process such as, for example, chemical vapor deposition (CVD). The replacement gate 114 is formed on and in contact with the first spacer 112 and comprises a single layer or multiple layers of oxide, polysilicon, amorphous silicon, nitride, or a combination thereof. The replacement gate 114 can be formed by CVD processes, thermal oxidation, or wet chemical oxidation. This replacement gate stack acts as a place holder for the actual gate stack to be formed after formation of the channel material for the device(s).

The second spacer 116 is formed on and in contact with the replacement gate 114. The spacer 116 comprises a dielectric material (such as silicon oxide, silicon nitride, silicon oxynitride, or a combination of these) and can be formed using any conventional deposition process such as, for example, CVD. The first and second spacers 112, 116 can comprise the same or different materials. The top oxide layer 118 is formed on and in contact with the second spacer 116 and comprises, for example, silicon dioxide. The top oxide layer 118 is a sacrificial layer and comprises a different dielectric material than the top spacer dielectric. The purpose of the top oxide layer 118 is to enable further processing.

Figure 6:
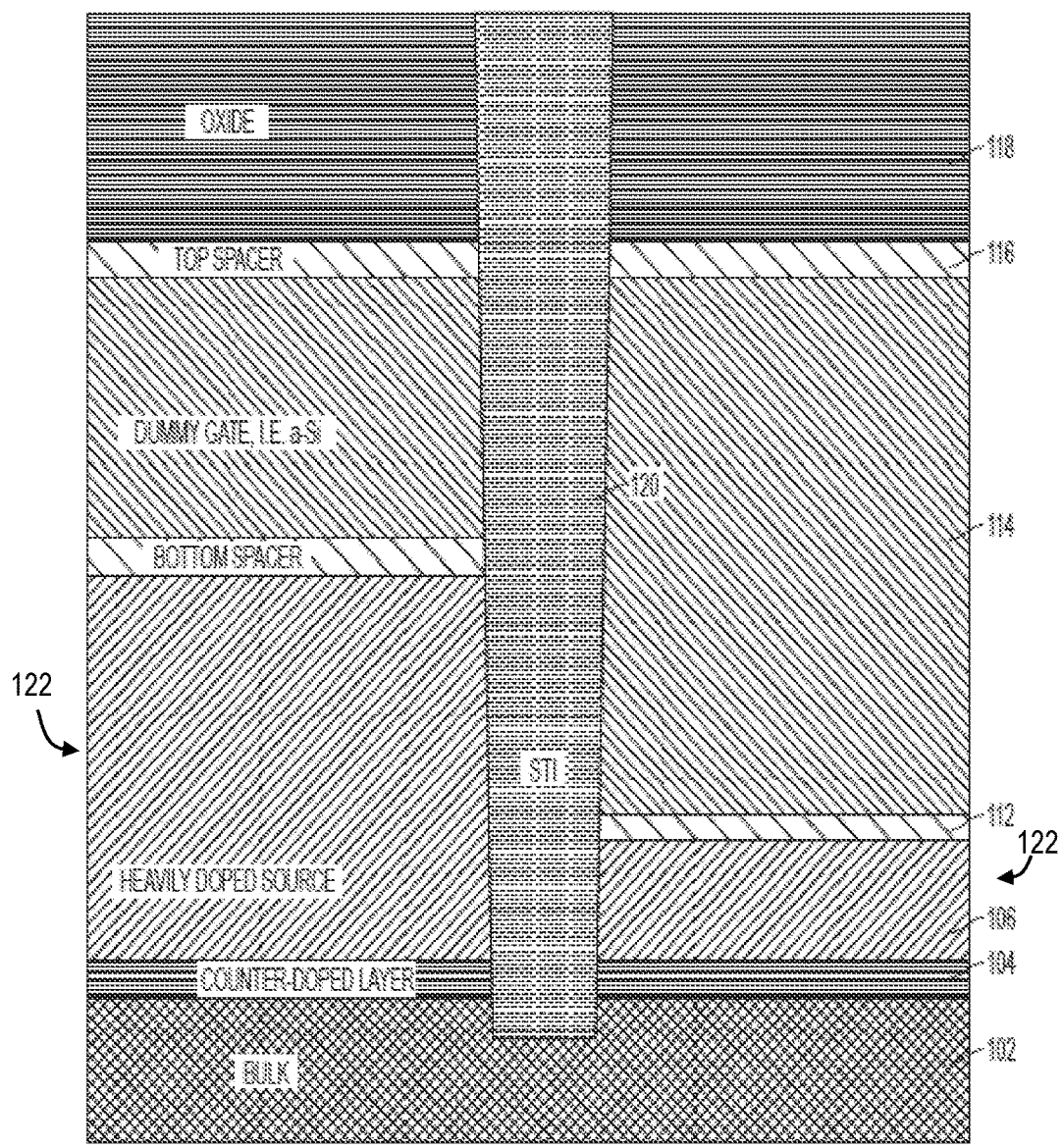
FIG. 6 is a cross-sectional view of the semiconductor structure after a shallow trench isolation has been formed according to one embodiment of the present disclosure.

FIG. 6 shows a shallow trench isolation (STI) 120 is formed through the top oxide layer 118, the second spacer 116, the replacement gate 114, the first spacer 112, the source layer 106, the counter-doped layer 104, and partially into the bulk substrate layer 102. The STI 120 partially separates the structure 100 into two regions 122 and 124.

Figure 7:
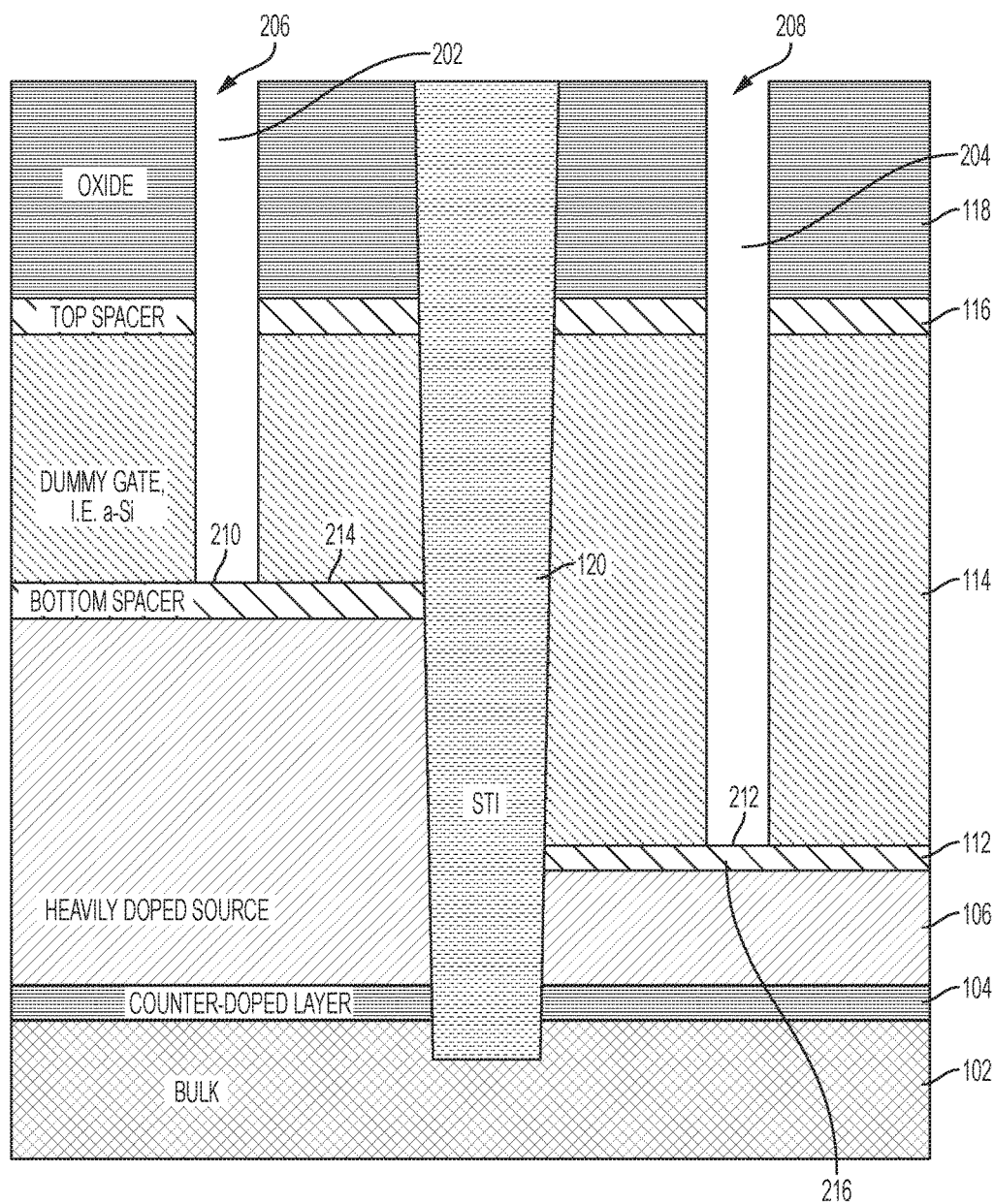
FIG. 7 is a cross-sectional view of the semiconductor structure after two channels have been formed down to the first (bottom) spacer according to one embodiment of the present disclosure.
Figure 8:
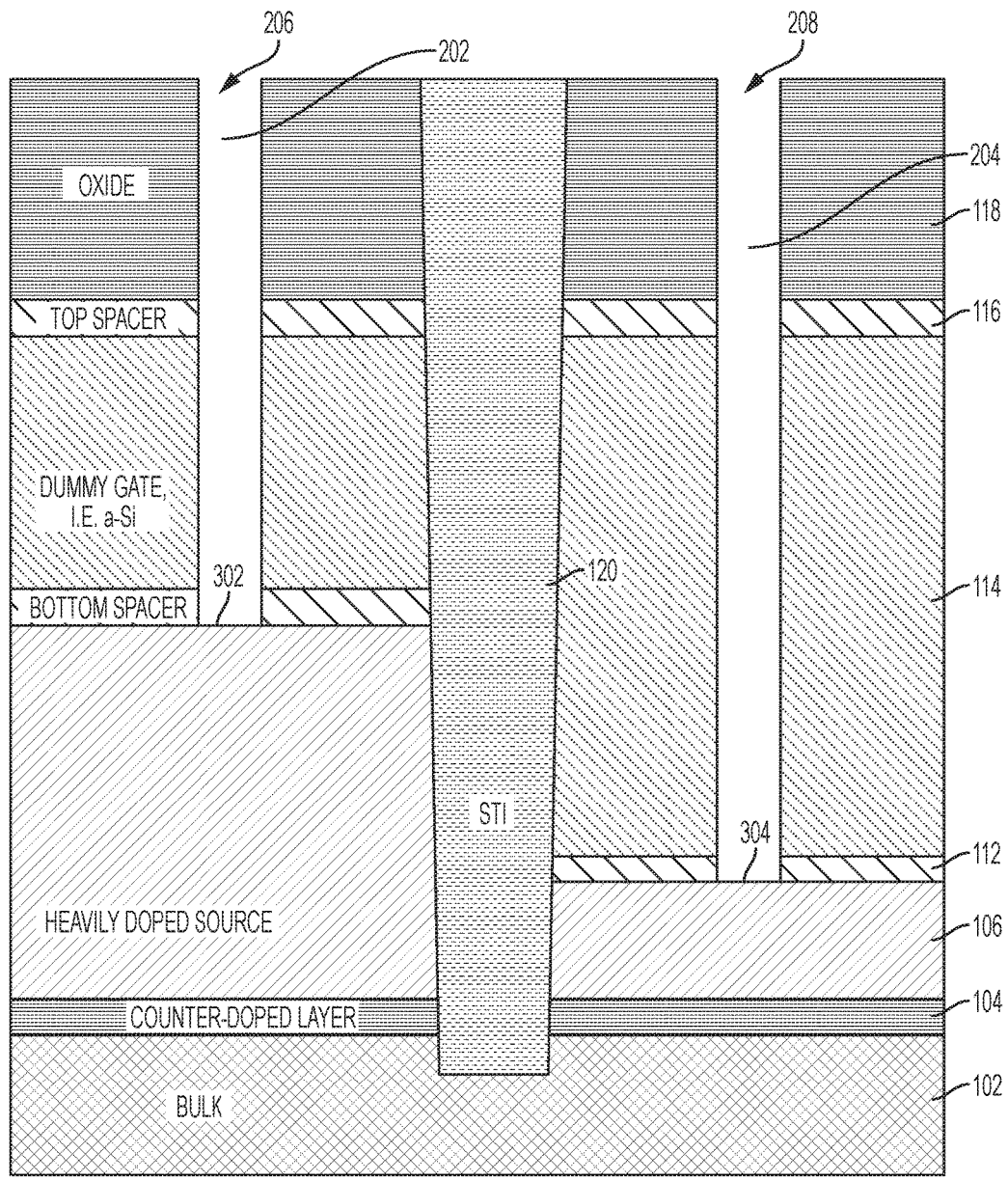
FIG. 8 is a cross-sectional view of the semiconductor structure after the two channels have been extended through the first (bottom) spacer to the heavily doped source according to one embodiment of the present disclosure.

FIG. 7 shows that multiple etching processes are performed to form channels/trenches 202, 204 within the structure 100 after the structure 100 shown in FIG. 6 has been formed. For example, a first etching process is performed to remove a portion of the top oxide layer 118 selective to the material of the second spacer 116. A second etching process is then performed to remove a portion of the second spacer 116, which underlies the portion of the trenches 202, 204 formed from the first etching process, selective to the material of the replacement gate 110. A third etching process is then performed to remove a portion of the replacement gate 110, which underlies the portion of the trenches 202, 204 formed from the second etching process, selective to the material of the first spacer 112. The resulting trenches 202, 204 extend through top surfaces 206, 208 of the top oxide layer 118 down to top surface 210, 212 of exposed portions 214, 216 of the first spacer 112. The exposed portions 214, 216 of the first spacer 112 are removed by an etching process to expose portions 302, 304 of the underlying source contact layer 106, as shown in FIG. 8. This creates self-aligned junctions because source extensions can be epitaxially grown from the source layer 104 to a top surface of the first spacer layer 112.

Figure 9:
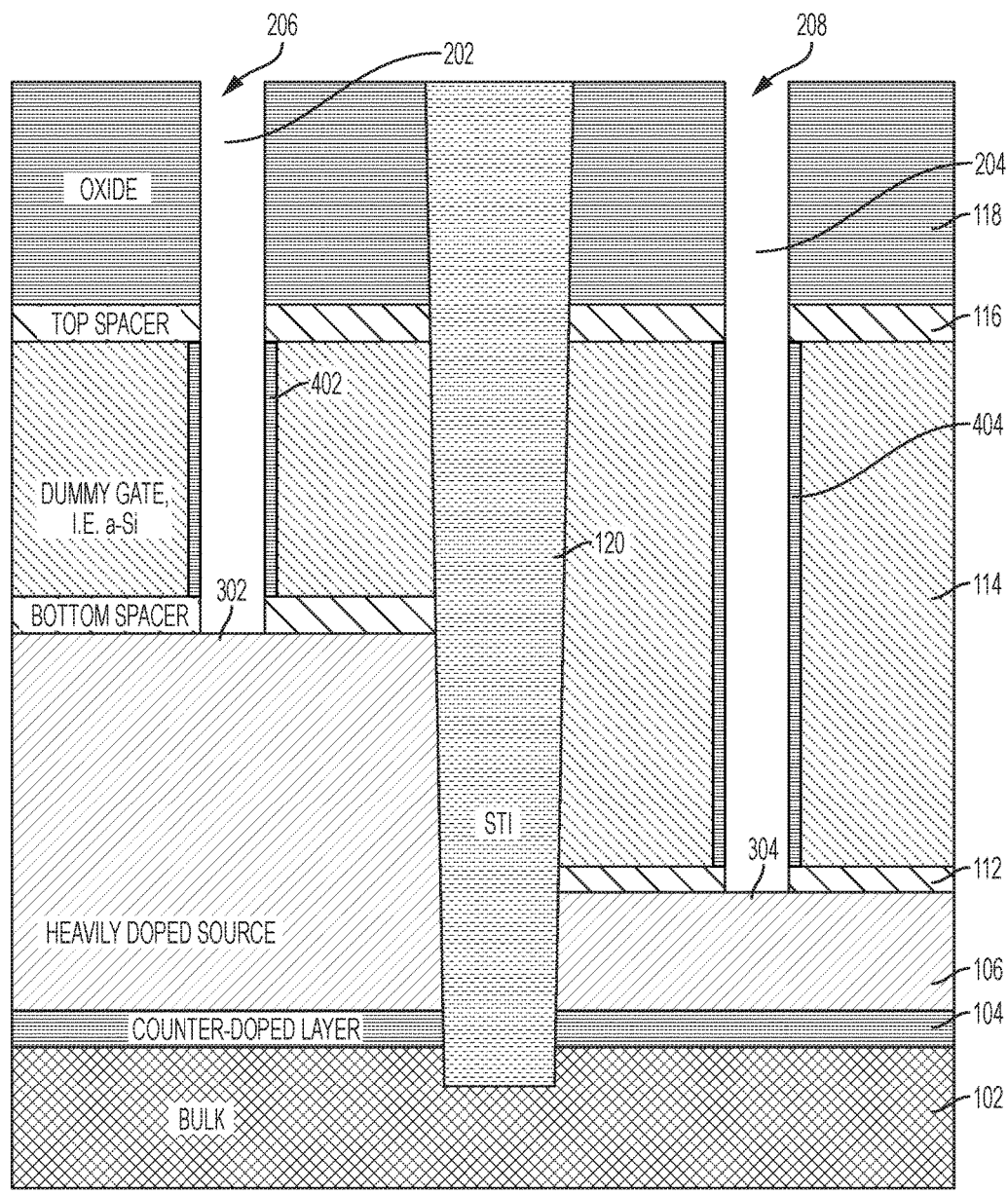
FIG. 9 is a cross-sectional view of the semiconductor structure after protective oxide layers have been formed on the sidewalls of the replacement gate exposed within the channels according to one embodiment of the present disclosure.
Figure 10:
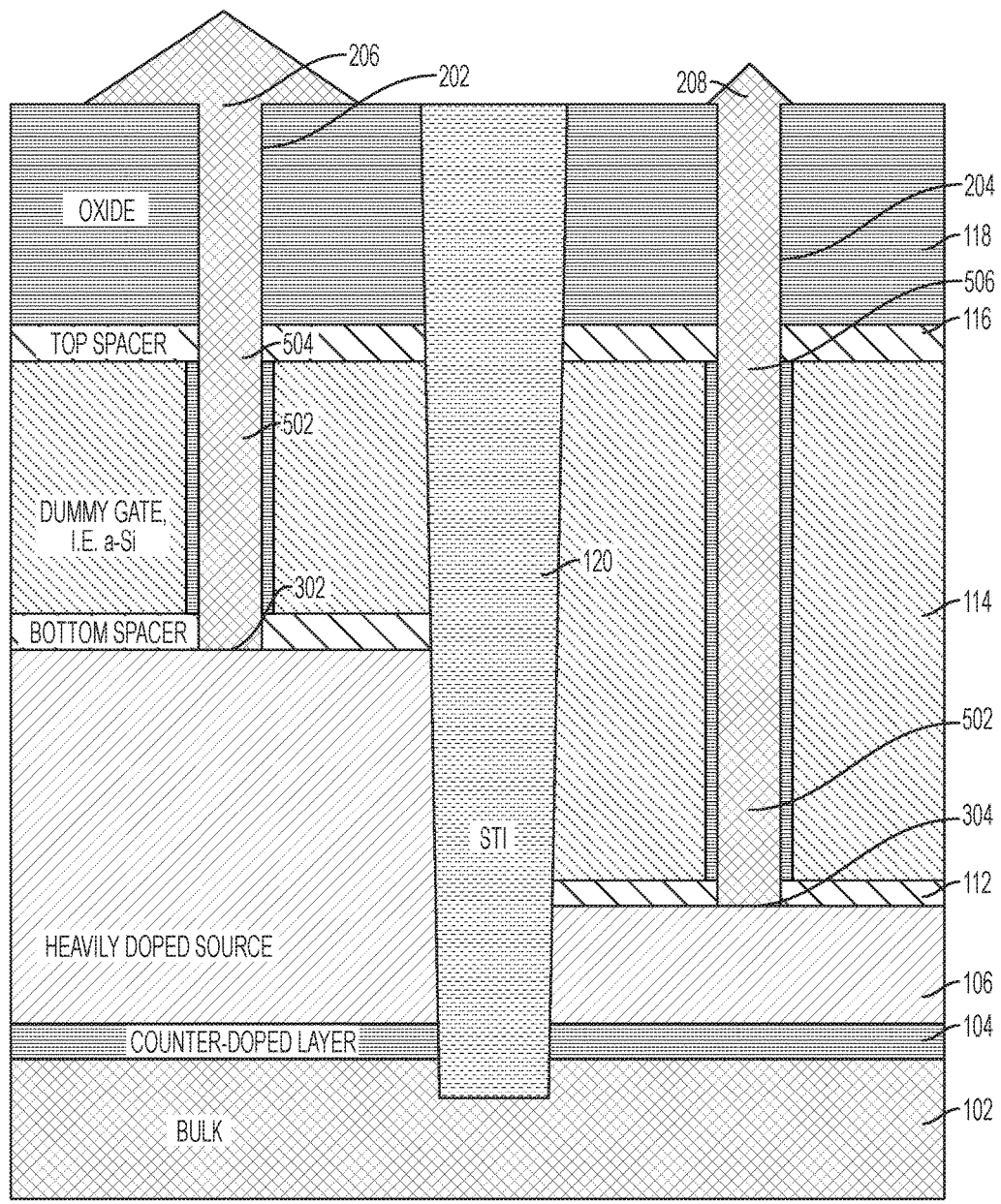
FIG. 10 is a cross-sectional view of the semiconductor structure after epitaxial growth of the heavily doped source layer in the two channels according to one embodiment of the present disclosure.

After the exposed portions 214, 216 of the first spacer 112 have been etched away, protective layers 402, 404 are formed on exposed sidewalls 406, 408 of the replacement gate 110 within the trenches 202, 204, as shown in FIG. 9. A plasma oxidation or other type oxidation process can be performed to form the protective layer 402, 404. An epitaxy process is performed to grow material within the trenches 202, 204 forming channels 504, 506. For example, as shown in FIG. 10, the epitaxy process grows the material 502 up from the portions 302, 304 of the source contact layer 106 exposed in the trenches 202, 204 above the top surfaces 206, 208 of the top oxide layer 118.

Figure 11:
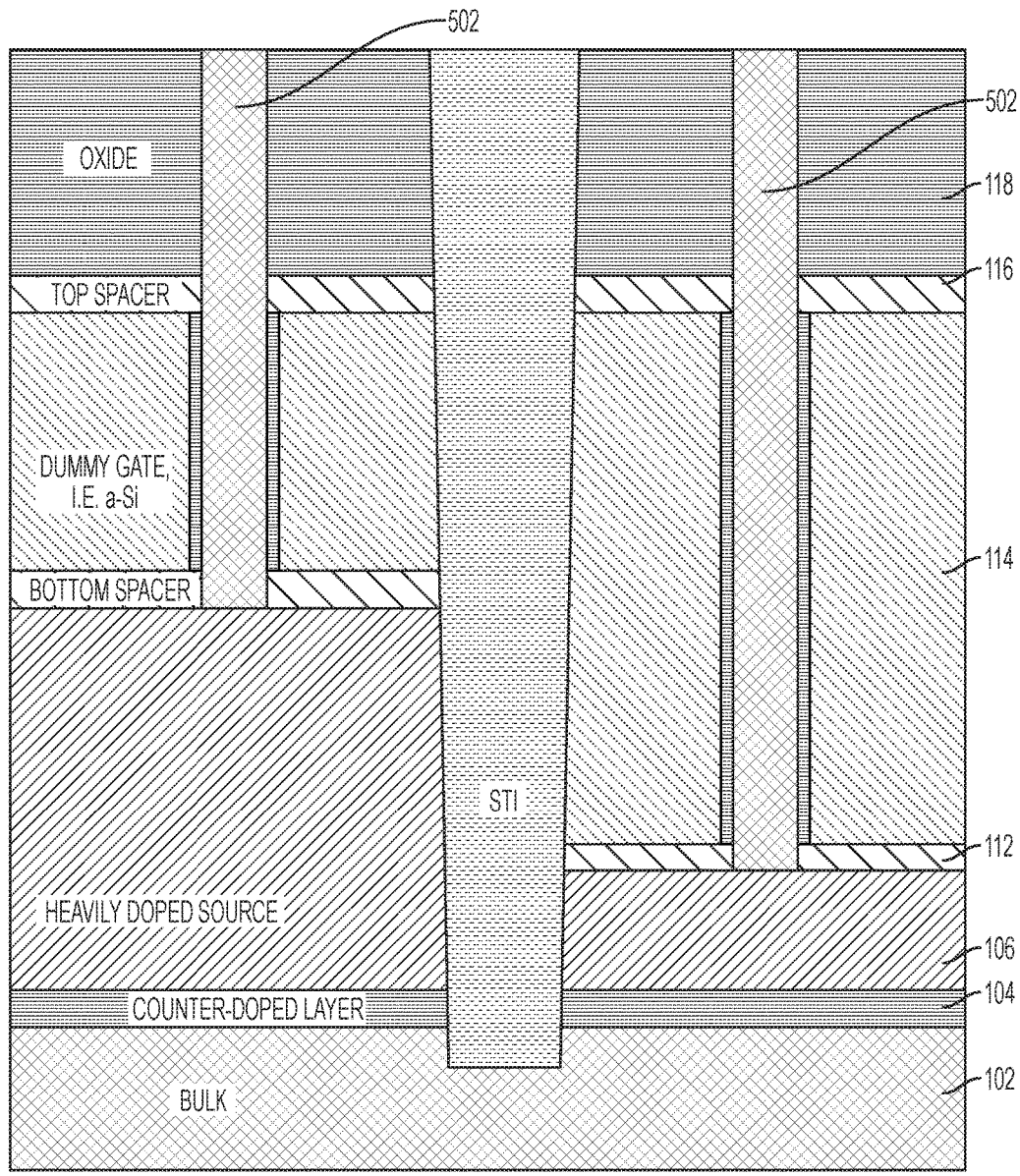
FIG. 11 is a cross-sectional view of the semiconductor structure after CMP of the epitaxial growth material to the top surface of the top oxide layer according to one embodiment of the present disclosure.

In one embodiment, the epitaxy process grows a material that has been doped. For example, for an nFET device, the channel 502 can comprise, for example, about $1.0\times10^{16}/cm^3$ to about $1.0\times10^{17}/cm^3$ phosphorous doped silicon, about $1.0\times10^{17}/cm^3$ to about $1.0\times10^{18}/cm^3$ phosphorous doped silicon, and/or the like. For a pFET device, the channel 502 can comprise, for example, about $1.0\times10^{17}/cm^3$ boron doped $SiGe_{0.20}$, about $1.0\times10^{17}/cm^3$ boron doped $SiGe_{0.30}$, and/or the like. In another embodiment, the material is undoped, for example having a concentration of about $1.0\times10^{15}/cm^3$. It should be noted that these materials (e.g., Ge, III-V materials, etc.) and doping concentrations are only illustrative and other materials and concentrations are applicable as well. The channel material and doping concentrations can be selected based on the desired threshold voltage of the device. Any overgrowth of channel material 502 are removed by, for example, a chemical-mechanical polishing (CMP) process that stops on the top oxide layer 118, as shown in FIG. 11.

Figure 12:
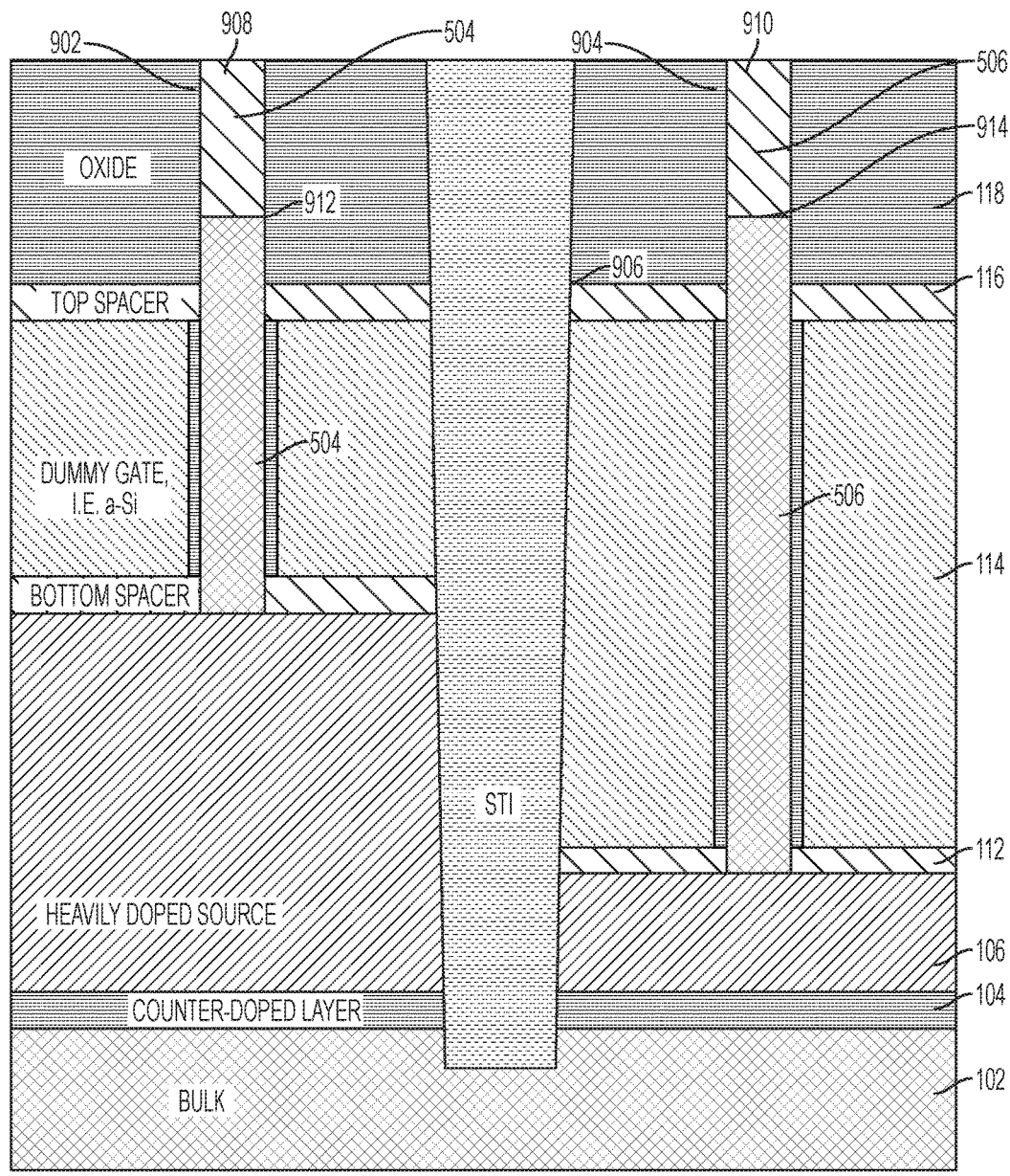
FIG. 12 is a cross-sectional view of the semiconductor structure after the tops of the two channels have been recessed and filled with a nitride mask according to one embodiment of the present disclosure.

FIG. 12 shows a portion of the first and second channels 504, 506 being partially recessed via an etching process. In this embodiment, the channels 504, 506 are partially recessed so that a portion 902, 904 (e.g., 15-50 nm) of each channel 504, 506 remains above a top surface 906 of the second spacer 116. A masking material such as nitride is then deposited and polished back (stopping on the top oxide layer 118) to form a mask layer 908, 910 on and in contact with a top surface 912, 914 of the channels 504, 506.

Figure 13:
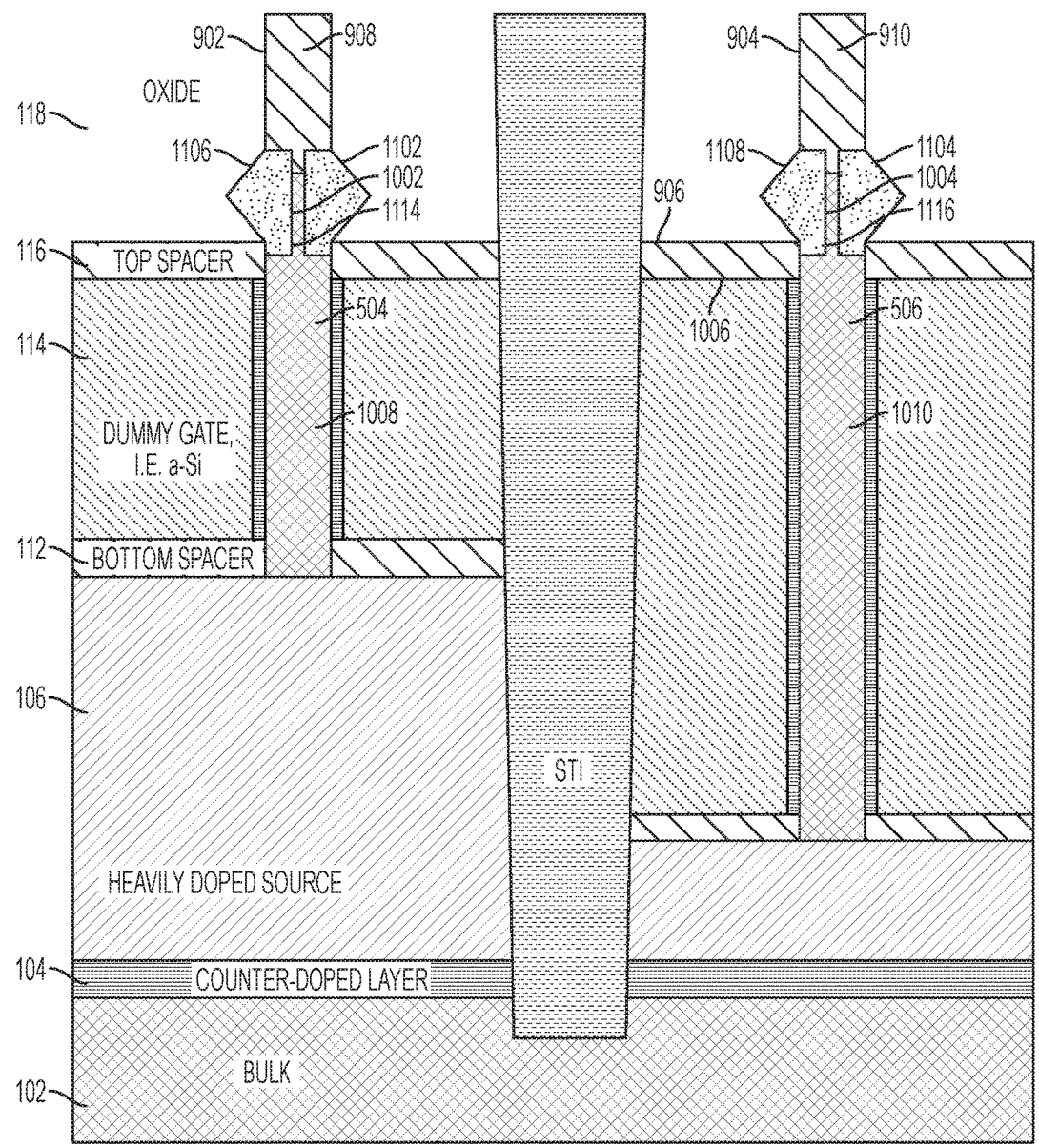
FIG. 13 is a cross-sectional view of the semiconductor structure after drain regions have been formed on the narrowed portions of the first and second channel layers according to one embodiment of the present disclosure.

FIG. 13 shows that the top oxide layer 118 is removed by, for example, by a wet etch process using diluted hydrofluoric acid, stopping on the second spacer layer 112. A lateral etch is then performed to narrow a portion 1002, 1004 of the channels 504, 506 where drain terminals of the devices are to be formed. The narrowed portions 1002, 1004 comprise the portions 902, 904 of the channels 504, 506 remaining above the second spacer 116 and a portion of the channels 504, 506 extending below the top surface 906 of the second spacer 116 and above a bottom surface 1006 of the second spacer 116. In one embodiment, the narrowed portions 1002, 1004 of the channels 504, 506 comprise a width of, for example 2 nm to 5 nm while the remaining portions 1008, 1010 of the channels 504, 506 comprise a width of width of 4 nm to 10 nm. The lateral etch can be, for example, a wet etch process.

A drain 1102, 1104 is then formed on the narrowed portions 1002, 1004 of the channels 504, 506. The drains 1102, 1104 extend from laterally from a top portion 1106, 1108 of the narrowed portions 1002, 1004 beyond the sidewalls 1110, 1112 of the un-narrowed portions 1008, 1010 of the channels 504, 506 and down to a top surface 1114, 1116 of the un-narrowed portions 1008, 1010. Therefore, a bottom portion 1118, 1120 of the drains 1102, 1104 is below the top surface 906 of the second spacer 116 and above the bottom surface 1006 of the second spacer 116.

The drains 1102, 1104 can be formed using an epitaxy process. The drain material can having a doping level of about $2 \times 10^{20}$ cm$^3$ to about $2 \times 10^{21}$ cm$^3$. For example, epitaxy that is selective with respect to the materials of the mask layers 908, 910 and the second spacer 116 is used grow material from the narrowed portions 1002, 1004 of the channels 504, 506 to form the drains 1102, 1104. The drains 1102, 1104 comprise in-situ doping (boron, in one embodiment for pFET and phosphorus, in one embodiment, for nFET). It should be noted that, according to one embodiment, the drains 1102, 1104 may not contain any doping. In the present embodiment, the doping can be performed using any standard approach such as ion implantation. In particular, the growth rates for (100) vs. (110) oriented planes are engineered so that during the epitaxial growth on (100) Si faceted drains are obtained. The drains 1102, 1104 comprise angled sides rather than completely abutting the gate. It should be noted that, non-faceted (i.e. vertical) epitaxy and/or multiple epitaxy steps can be used to form the drain structure without limiting the scope of the present disclosure.

Figure 14:
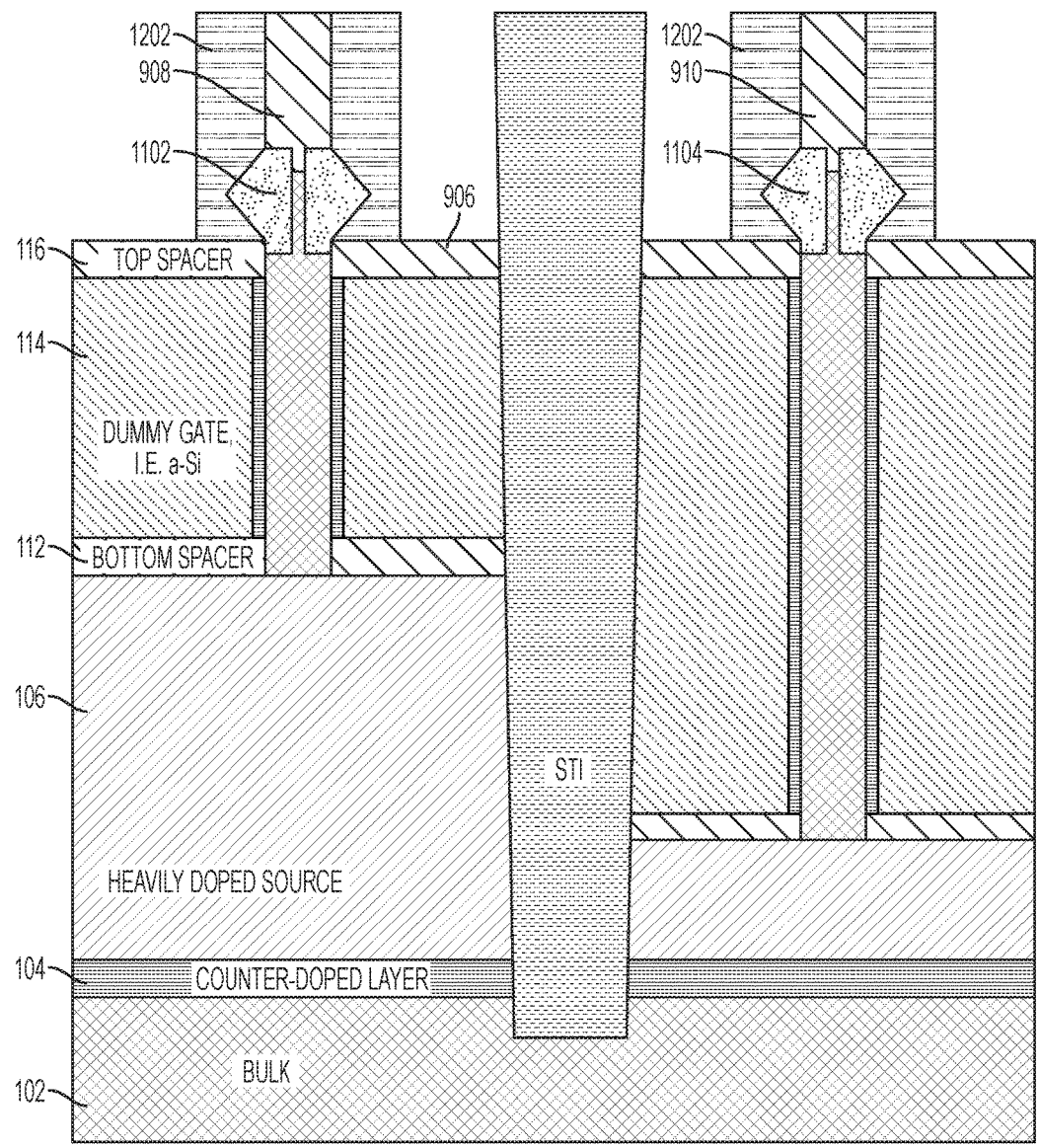
FIG. 14 is a cross-sectional view of the semiconductor structure after spacers have been formed on the drain regions and top spacer layer according to one embodiment of the present disclosure.

FIG. 14 shows that the drains 1102, 1104 are masked with a sacrificial spacer 1202, comprising a dielectric material (such as silicon oxide, silicon nitride, silicon oxynitride, or a combination of these) is formed on and in contact with the sidewalls of the mask layers 908, 910, the sidewalls of the drains 1102, 1104, and the top surface 906 of the second spacer layer 112. The sacrificial spacer 1202 can extend 2 nm to 10 nm past the edge of the drain epitaxy on each side. The spacer 1202 extends laterally beyond the drains 1102, 1104 and is planar with a top surface of the mask layers 908, 910. In the illustrated embodiment, the dielectric material is formed and then reactive-ion etching is used to remove the dielectric material except from the sidewalls of the mask layers 908, 910, the sidewalls of the drains 1104, 1106, and the top surface 906 of the second spacer layer 112.

Figure 15:
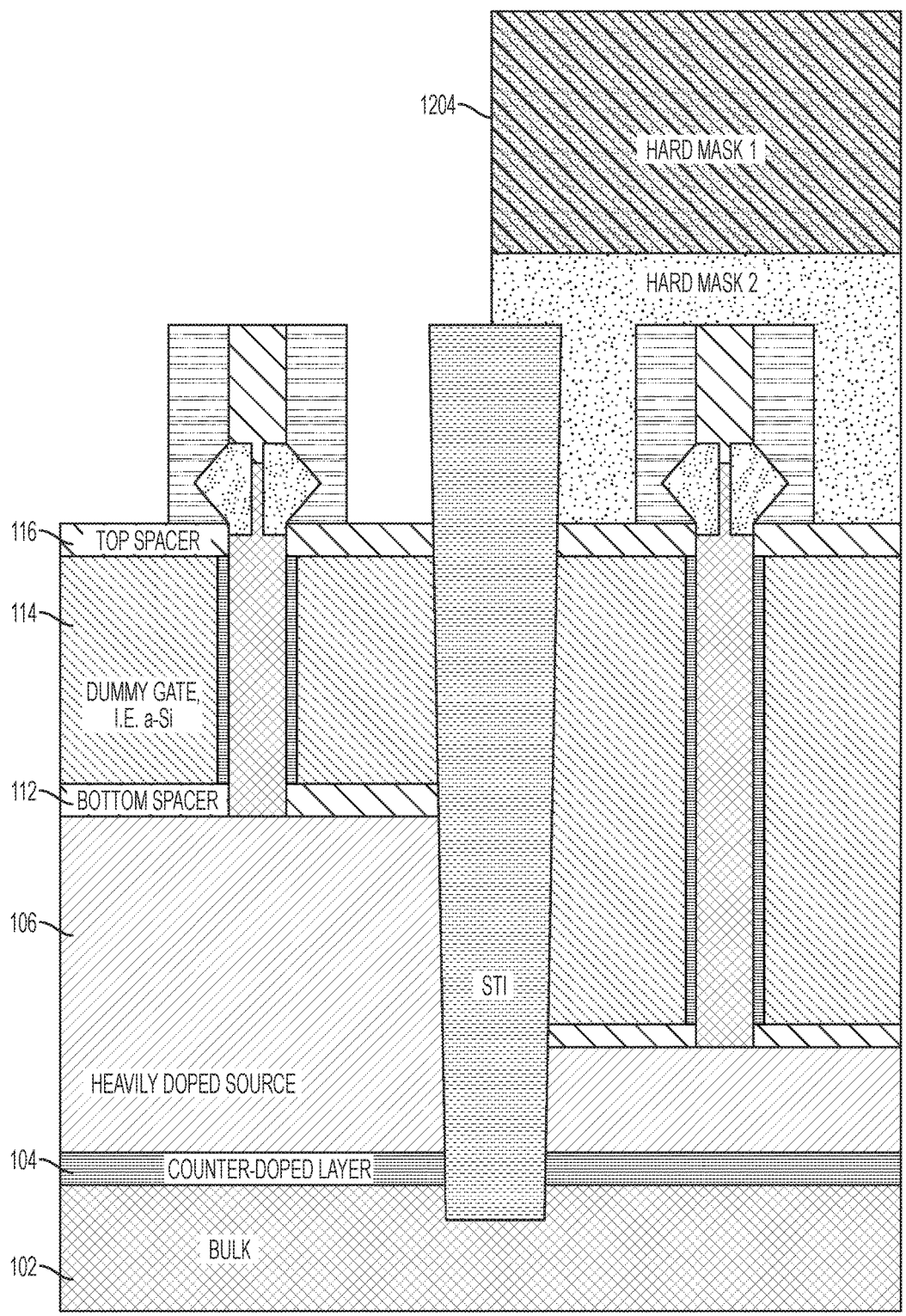
FIG. 15 is a cross-sectional view of the semiconductor structure after a hard mask has been formed on the long channel thick oxide device region according to one embodiment of the present disclosure.
Figure 16:
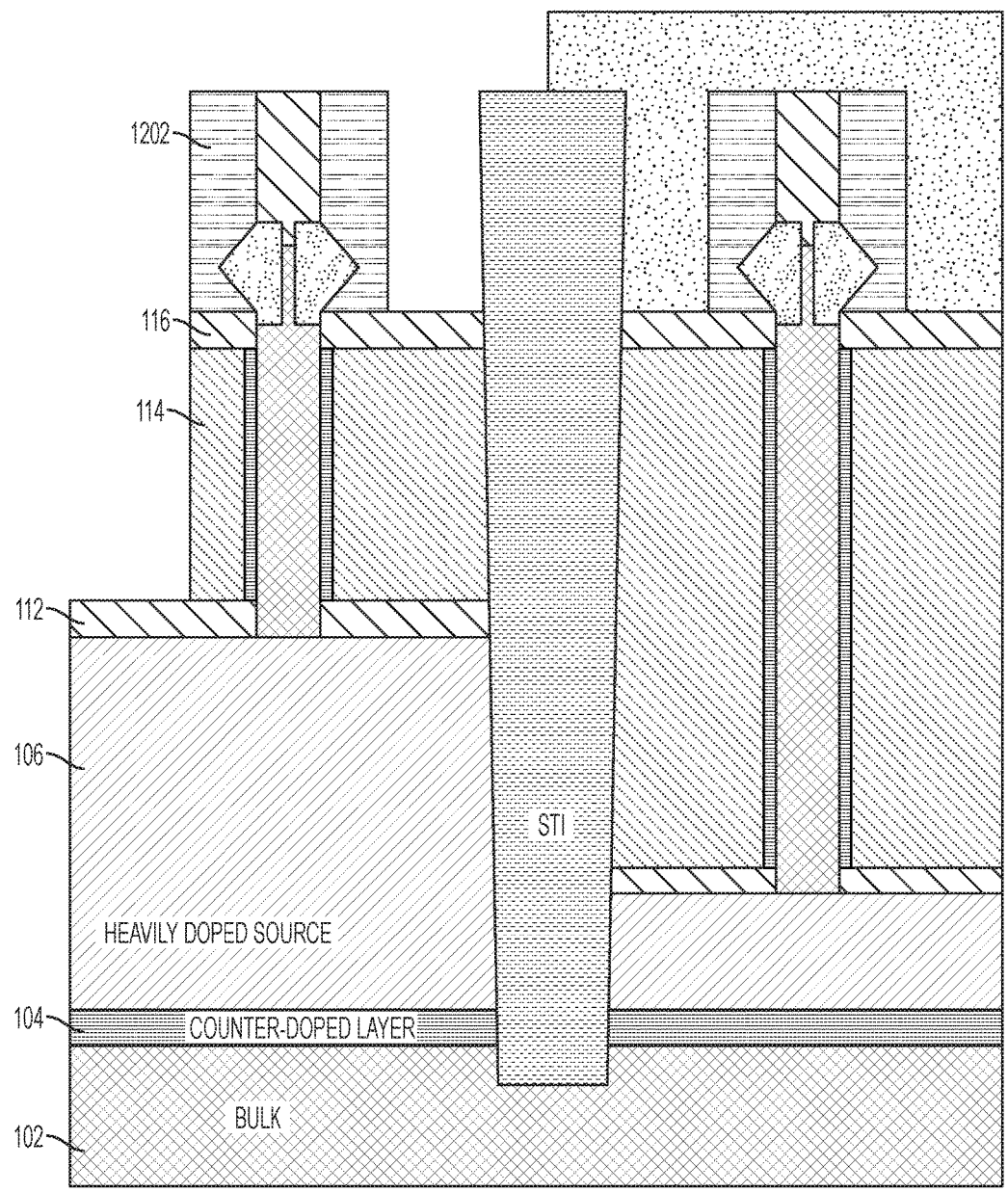
FIG. 16 is a cross-sectional view of the semiconductor structure after a portion of the oxide layer and a portion of the top spacer in the short channel non-thick oxide device region have been removed according to one embodiment of the present disclosure.
Figure 17:
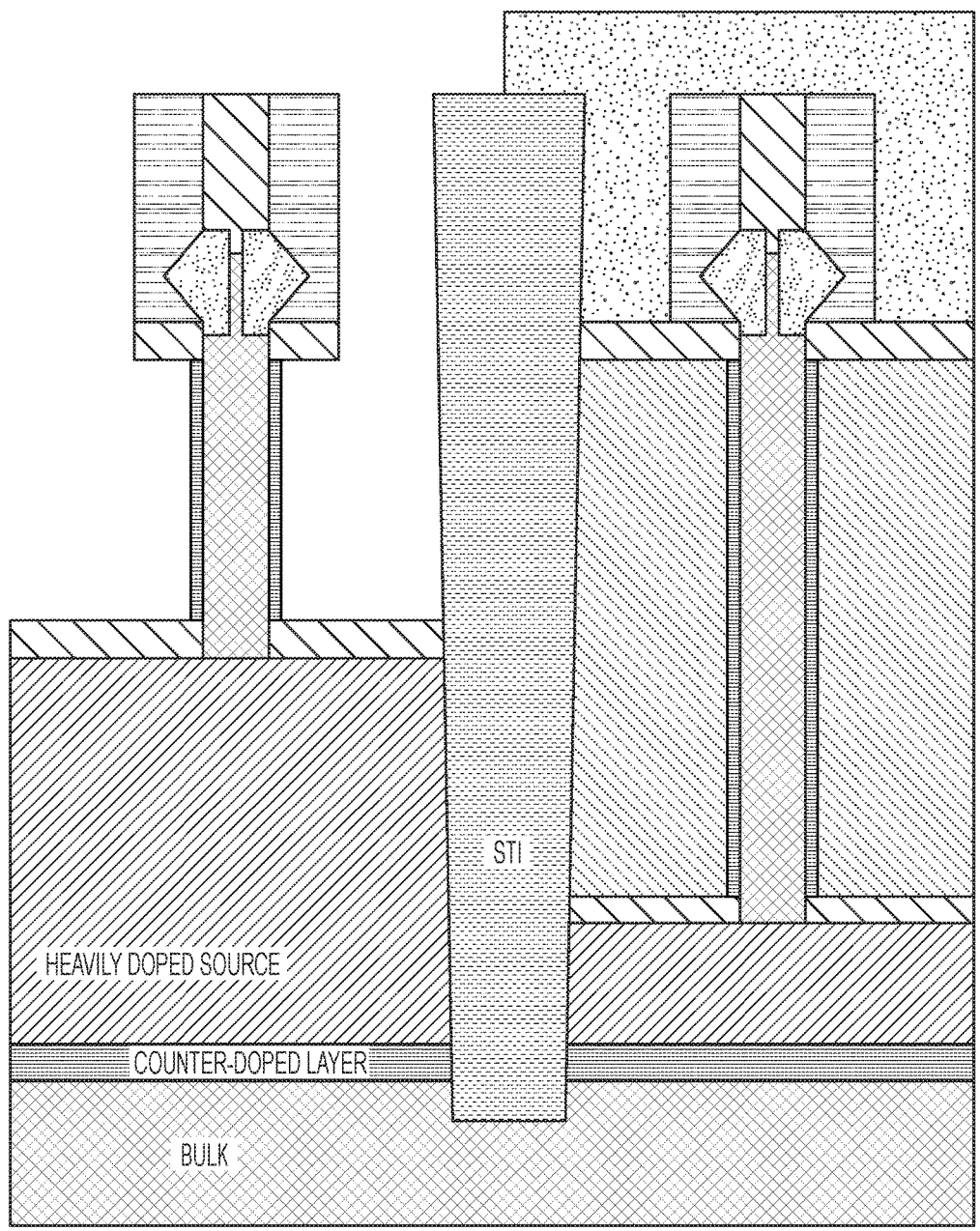
FIG. 17 is a cross-sectional view of the semiconductor structure after the remainder of the oxide layer in the short channel non-thick oxide device region has been removed according to one embodiment of the present disclosure.

As shown in FIG. 15, a hard mask 1204 is formed on the long channel thick oxide device region to allow further processing of the short channel non-thick oxide device. FIG. 16 shows further processing of the short channel non-thick oxide device. The second spacer layer 112 and the replacement gate 110 not underlying the sacrificial spacer 1202 are then removed. For example, a first etching process such as RIE is performed to etch portions of the second spacer 116 not underlying the sacrificial spacer 1202 selective to the replacement gate 110. A second etching process such as RIE is then performed to etch portions of the replacement gate 110 not underlying the sacrificial spacer 1202 selective to the first spacer layer 112. Portions of the replacement gate 110 underlying the sacrificial spacer 1202 and the protective layers 402, 404 are then removed exposing channel 502, as shown in FIG. 17. The portions of the replacement gate 110 underlying the sacrificial spacer 1202 and the protective layers 402, 404 can be removed by selective etching or another technique.

Once the replacement gate 110 and protective layers 402, 404 have been removed, an RMG process is performed. For example, as shown in FIG. 17, a high-k dielectric material is blanket deposited over the entire structure 100, for example by CVD (chemical vapor deposition), PECVD (plasma enhanced chemical vapor deposition), or ALD (Atomic layer deposition). The high-k gate dielectric layer 1502 is formed on, in contact with, and conforming to a top surface 1505 of the first spacer layer 112, sidewalls of channel 504, a bottom surface 1510 of portions 1514 of the second spacer layer 112 underlying the sacrificial spacer 1202, and sidewall 1517 of the portions 1514 of the second spacer layer 112. The high-K gate dielectric layer 1502 can have a thickness between about 0.1 nm and about 3 nm.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum and aluminum.

Figure 18:
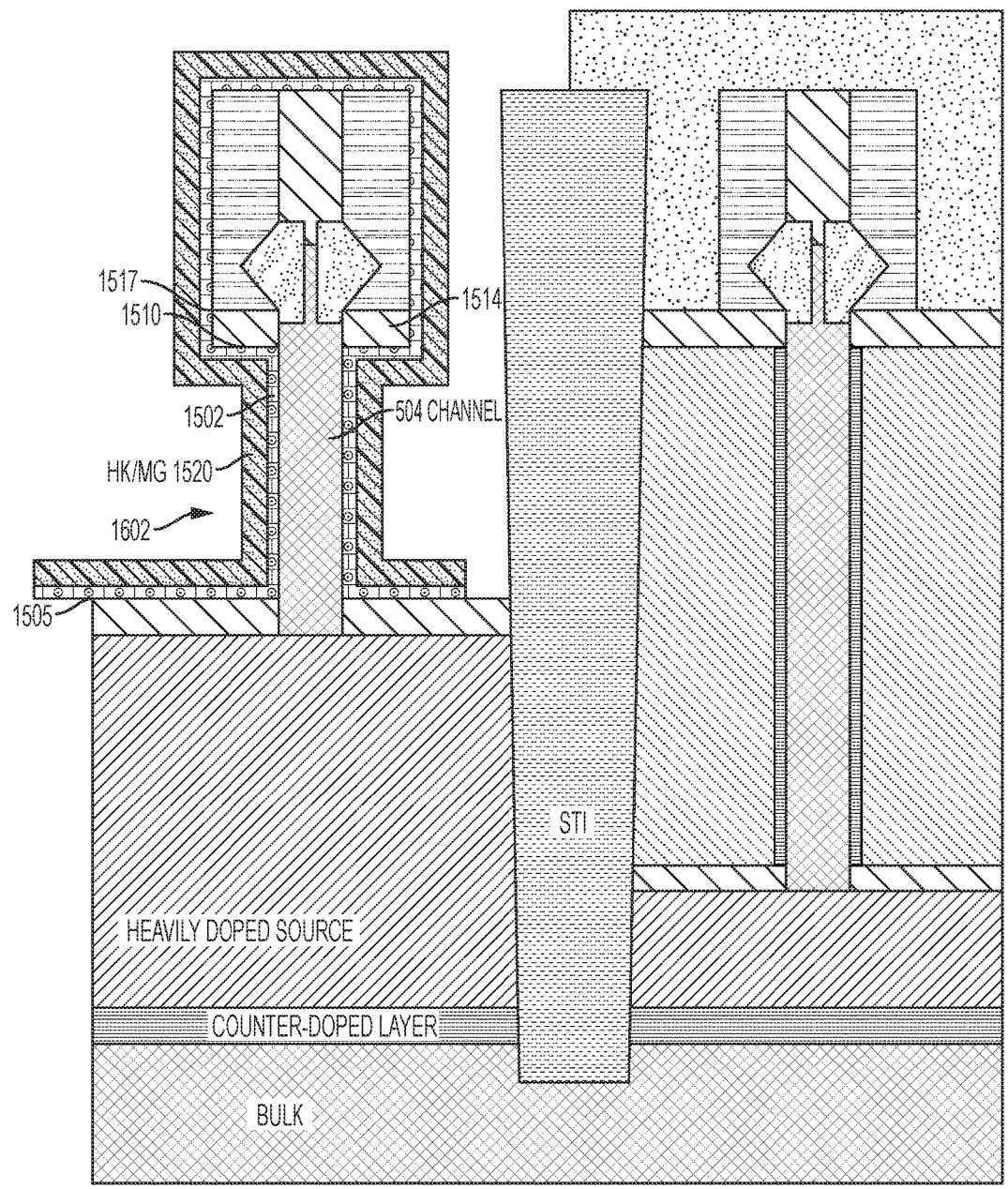
FIG. 18 is a cross-sectional view of the semiconductor structure after the protective oxide layer has been removed from the short channel non-thick oxide device region and a high-k metal gate has been deposited according to one embodiment of the present disclosure.

Still referring to FIG. 17, one or more conductive materials 1520 are then deposited on the high-k gate dielectric layer 1502 and etched/polished to form metal gate 1602 conforming to and in contact with the high-k gate dielectric layer 1502. The metal gate 1602 comprises a configuration similar to that of the high-k gate dielectric layer 1502. The metal gate 1602 can have a thickness between about 20 nm and about 50 nm. The high-k/metal gate structure is processed by an anisotropic etch. In one embodiment, the configuration of the metal gate 1602 forms a C or rotated U shape as shown in FIG. 18.

In one embodiment, the conductive material comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The conductive material may comprises multiple layers such as gate workfunction setting layer (work function metal) and gate conductive layer.

Figure 19:
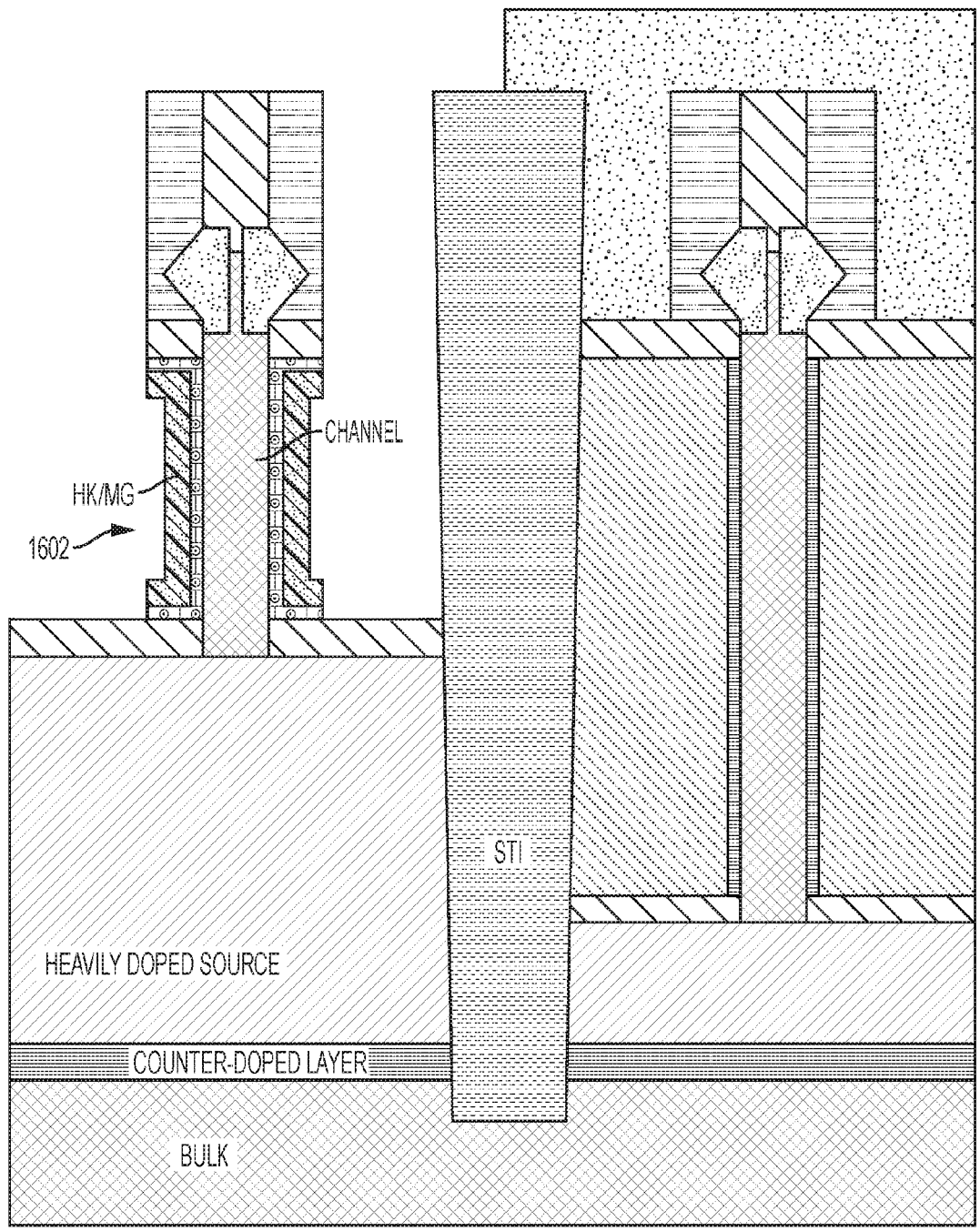
FIG. 19 is a cross-sectional view of the semiconductor structure after an anisotropic etch of the high-k metal gate according to one embodiment of the present disclosure.

FIG. 19 shows that a gate fill material layer 1702 is blanket deposited over the short channel non-thick oxide device. The gate fill material layer 1702 can be, for example, tungsten or aluminum. The gate fill material layer 1702 is then polished using, for example, CMP.

Figure 20:
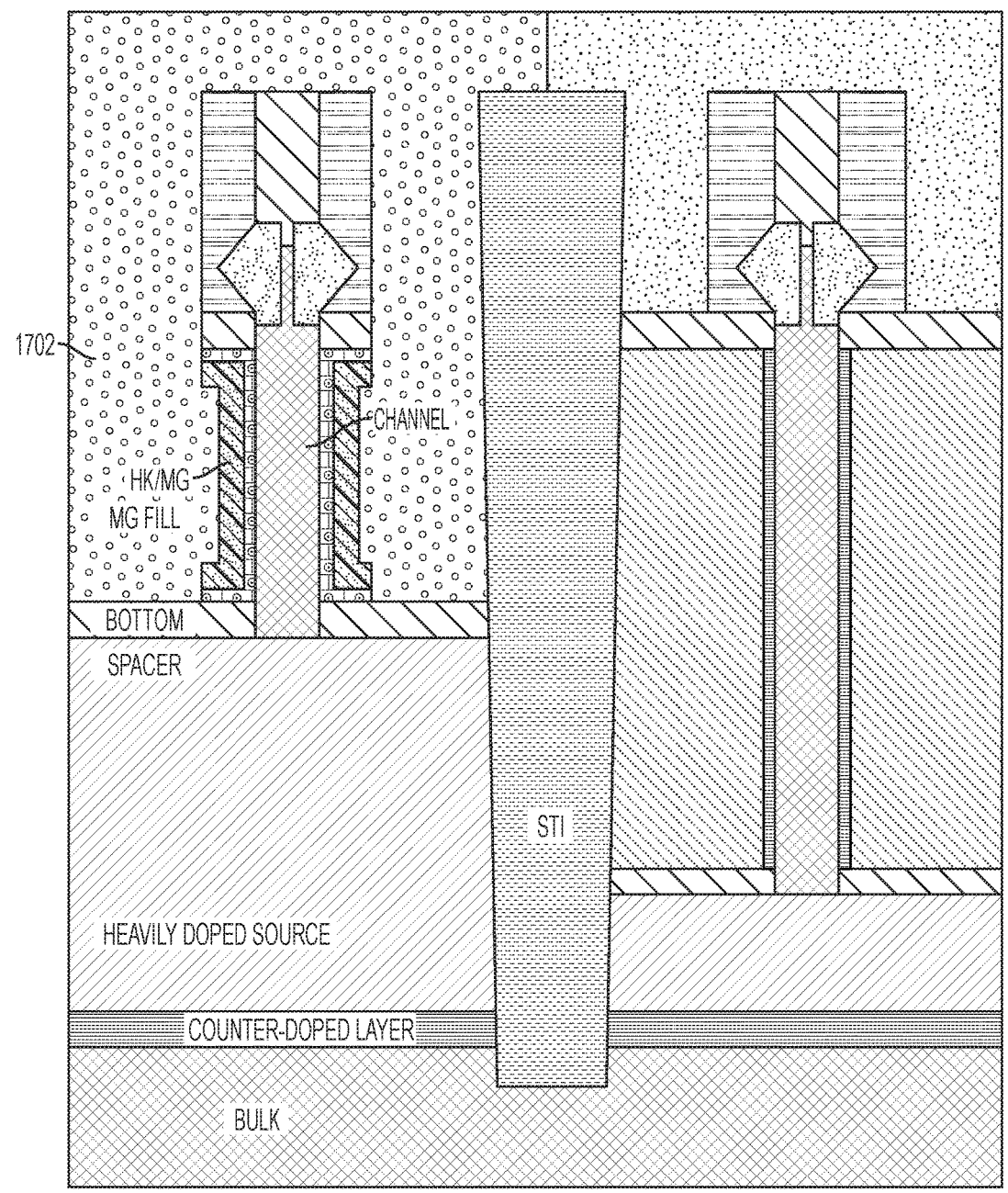
FIG. 20 is a cross-sectional view of the semiconductor structure after gate fill material has been deposited in the short channel non-thick oxide device region and CMP of the gate fill material according to one embodiment of the present disclosure.
Figure 21:
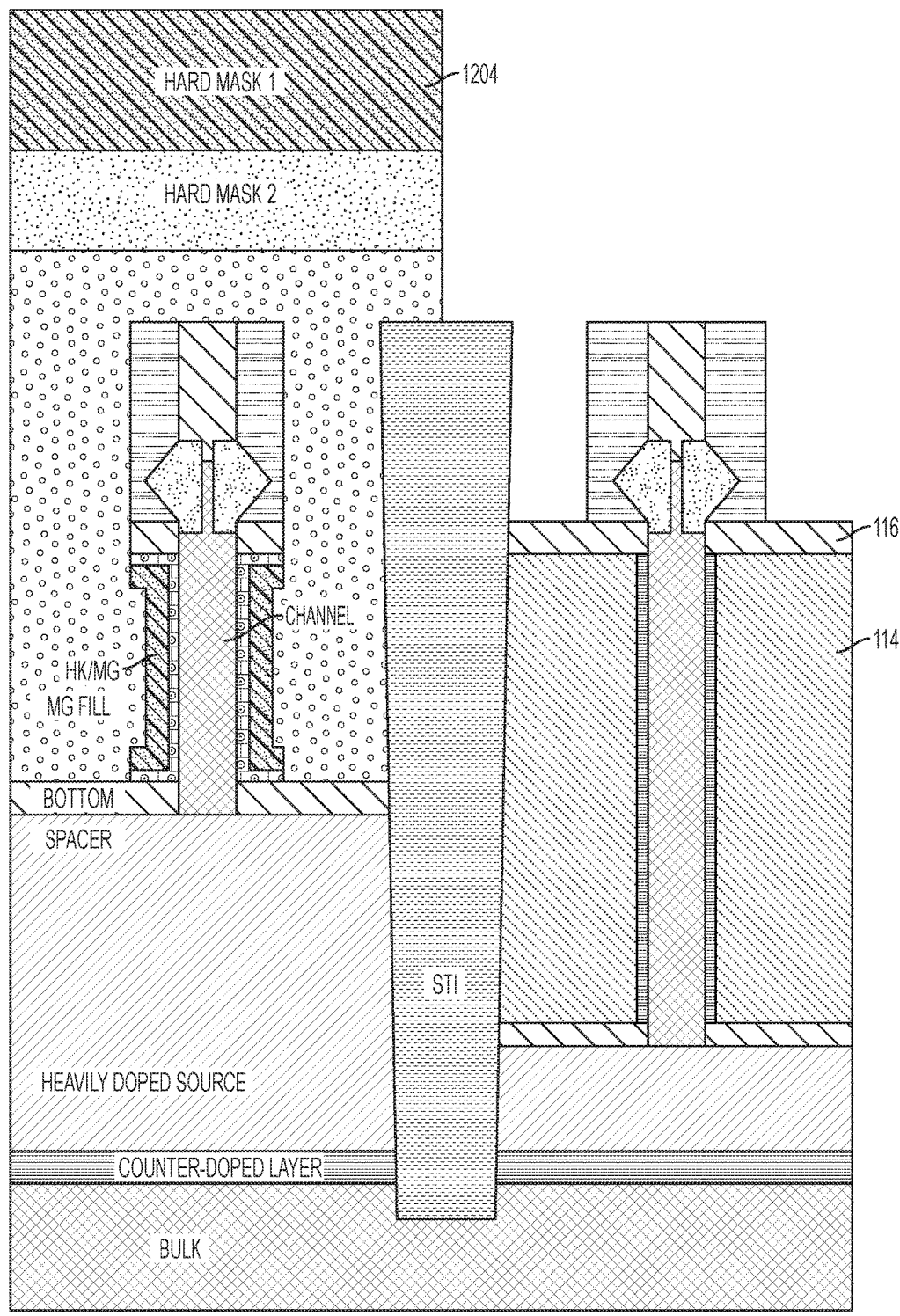
FIG. 21 is a cross-sectional view of the semiconductor structure after removal of the hard mask from the long channel thick oxide device region and forming a hard mask on the short channel non-thick oxide device region according to one embodiment of the present disclosure.

As shown in FIGS. 20-21, the long channel thick oxide device region is processed. As shown in FIG. 20, the thick oxide device mask is removed, for example, by an etching process such as RIE. A hard mask 1204 is deposited on the short channel non-thick oxide device. Non-limiting examples of suitable materials for the hard mask layer include silicon oxide, silicon nitride, or any combination thereof. The thickness of the hard mask layer is not intended to be limited.

Figure 22:
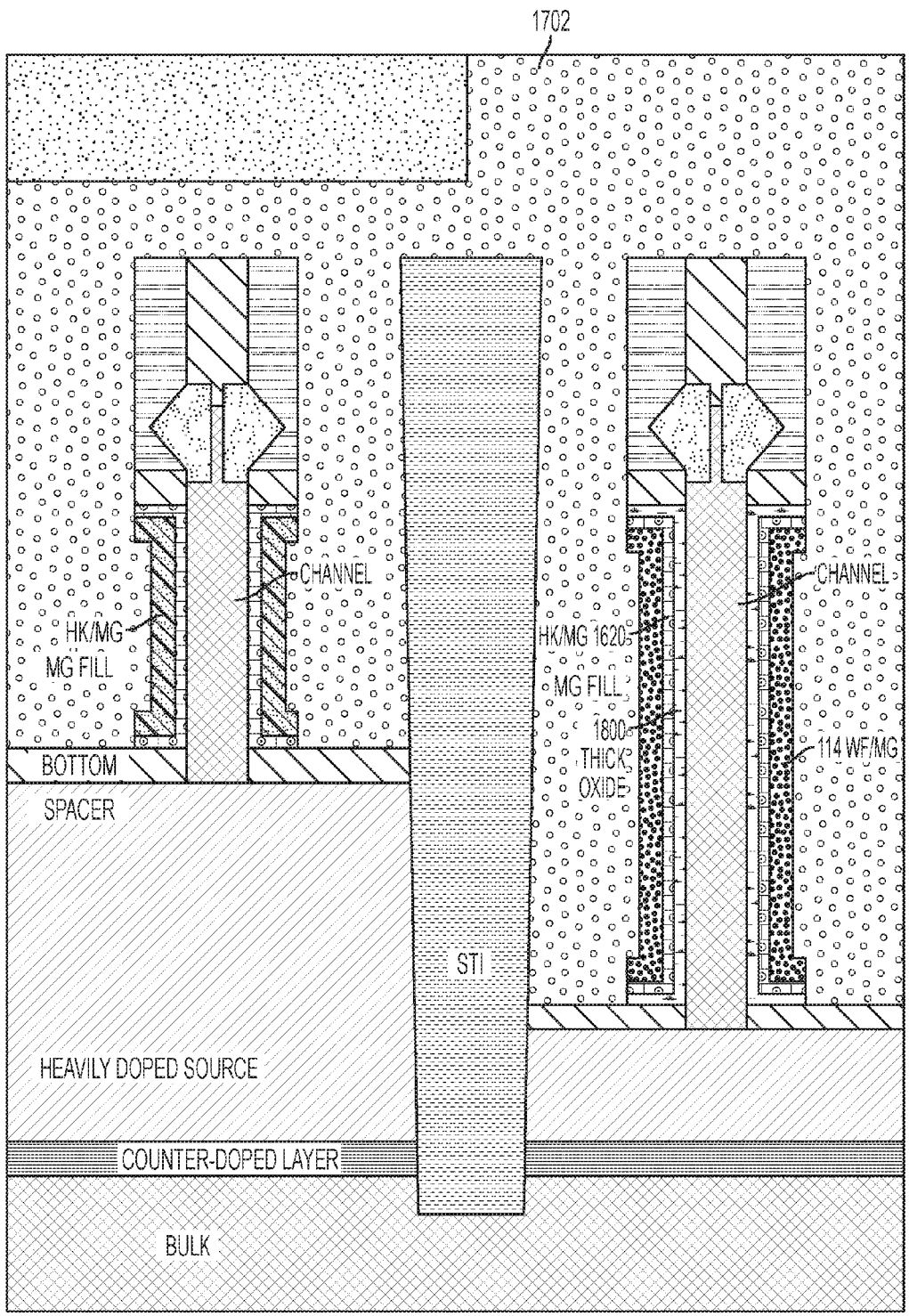
FIG. 22 is a cross-sectional view of the semiconductor structure after the long channel thick oxide device region is processed in a similar fashion and then a thick oxide is deposited, high-k metal gate is formed, a work function metal gate is formed, and a gate material fill is performed according to one embodiment of the present disclosure.
Figure 23:
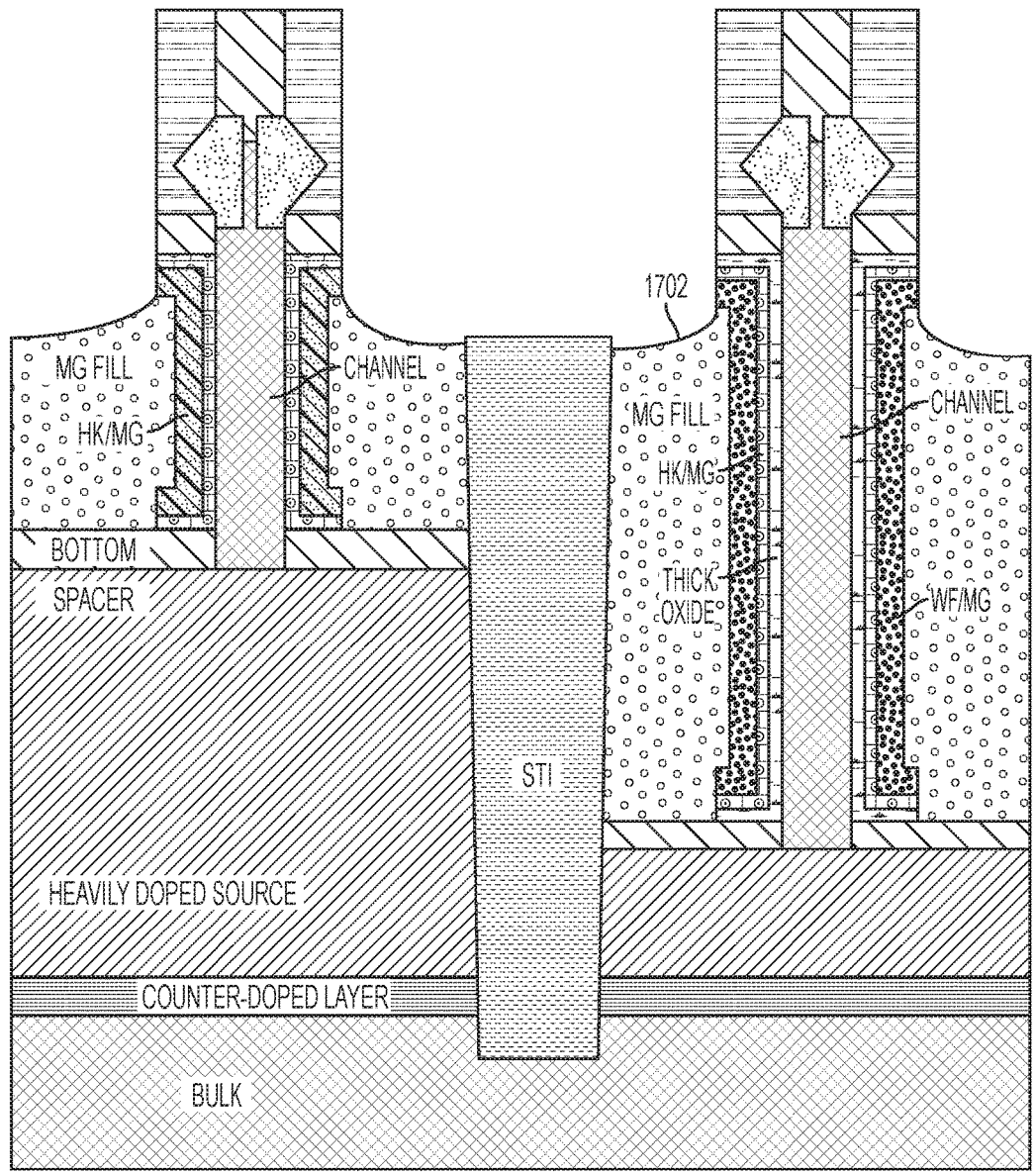
FIG. 23 is a cross-sectional view of the semiconductor structure after the gate fill material has been recessed according to one embodiment of the present disclosure.

As shown in FIGS. 21 and 22, the long channel thick oxide device is processed in a similar fashion as the short channel non-thick oxide device (i.e., removal of the replacement layer 114 and portions of the second spacer 116). Then a thick oxide layer 1800 is deposited and in contact with the side walls of the long channel and portions of the second and first spacers. In one embodiment, the thick oxide layer 1800 has an EOT of about 1 nm to about 5 nm, specifically about 2 nm to about 4 nm, and more specifically about 3 nm. A high-k metal gate 1602 is formed as described above on the thick oxide layer 1800. A work function metal gate is formed on the high-k metal gate. The three layers comprise similar configurations. As described above, gate fill material is deposited on the long channel thick oxide device. As shown in FIG. 23, the gate fill material layer 1702 can be recessed. Lithography and etching processes are used to pattern the recessed gate fill material layer 1702.

An interlayer dielectric is deposited and CMP. Metal oxide layer contacts are formed by etching to form trenches followed by a metallization process. The metallization can involve CVD, PVD, ALD, or electroplating processes or some combination of these processes. The structure is further processed by back end of the line procedures.

Figure 24:
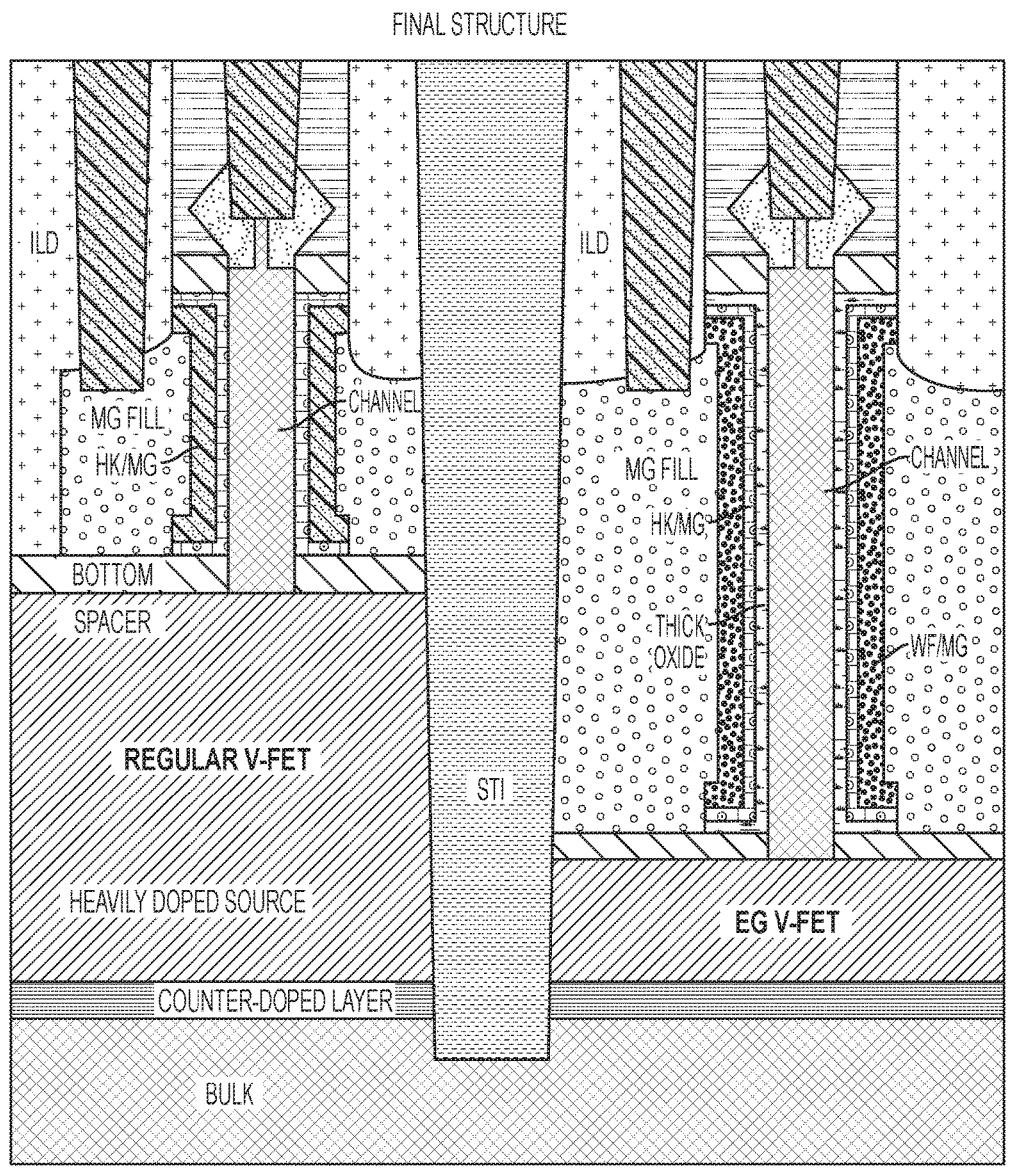
FIG. 24 is a cross-sectional view of the final semiconductor structure after MOL and BEOL processing.

As shown in FIG. 24, the final structure comprises a short channel non-thick oxide device ("Regular V-FET") and a long channel thick oxide device ("THICK OXIDE V-FET"). The THICK OXIDE V-FET has a thicker oxide and a different work function metal gate than the Regular V-FET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The methods depicted herein are just one example. There may be many variations to the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate;
   a first vertical transistor device having a first region on a doped source contact layer of the substrate and having a first drain; and
   a second vertical transistor device having a second region on the doped source contact layer of the substrate and having a second drain;
   wherein the first vertical transistor device comprises a short vertical channel, and the second vertical transistor device comprises a long vertical channel having a vertical length greater than the short vertical channel.

2. The semiconductor structure of claim 1, wherein the long vertical channel comprises an oxide having an equivalent oxide thickness of about 1 to about 5 nanometers.

3. The semiconductor structure of claim 1, further comprising a metal gate in contact with sidewalls of a first epitaxially grown channel layer, a top surface of the first spacer layer, and a bottom surface of the second spacer layer:
   wherein the first spacer layer and the second spacer layer are separate and do not touch.

4. A semiconductor structure comprising:
   a source contact layer formed on a substrate, the source contact layer comprising a first thickness in a first region of the substrate and a second thickness in a second region of the substrate, the first thickness greater than the second thickness;
   a short channel, non-thick oxide vertical transistor device formed on a surface of the source contact layer in the first region of the substrate; and
   a long channel, thick oxide vertical transistor device formed on a surface of the source contact layer in the second region of the substrate.

* * * * *